(12) United States Patent
Berthelot et al.

(10) Patent No.: US 11,312,618 B2
(45) Date of Patent: Apr. 26, 2022

(54) MICRODEVICE COMPRISING AT LEAST TWO MOVABLE ELEMENTS

(71) Applicant: COMMISSARIAT À L'ÉNERGIE ATOMIQUE ET AUX ÉNERGIES ALTERNATIVES, Paris (FR)

(72) Inventors: Audrey Berthelot, Saint-Ismier (FR); Mikaël Colin, Grenoble (FR); Alain Jeanroy, Moissy-Cramayel (FR); Guillaume Lehee, Moissy-Cramayel (FR); Olivier Vancauwenberghe, Moissy-Cramayel (FR); Philippe Onfroy, Moissy-Cramayel (FR); Jean-Sébastien Mace, Moissy-Cramayel (FR)

(73) Assignee: COMMISSARIAT À L'ÉNERGIE ATOMIQUE ET AUX ÉNERGIES ALTERNATIVES SAFRAN, Paris (FR)

( * ) Notice: Subject to any disclaimer, the term of this patent is extended or adjusted under 35 U.S.C. 154(b) by 109 days.

(21) Appl. No.: 16/492,345

(22) PCT Filed: Mar. 14, 2018

(86) PCT No.: PCT/FR2018/050597
§ 371 (c)(1),
(2) Date: Sep. 9, 2019

(87) PCT Pub. No.: WO2018/172661
PCT Pub. Date: Sep. 27, 2018

(65) Prior Publication Data
US 2021/0130158 A1    May 6, 2021

(30) Foreign Application Priority Data

Mar. 16, 2017 (FR) ...................................... 1752155

(51) Int. Cl.
*B81B 3/00* (2006.01)
*B81B 5/00* (2006.01)

(52) U.S. Cl.
CPC ............... *B81B 3/0059* (2013.01); *B81B 5/00* (2013.01); *B81B 2203/0163* (2013.01); *B81B 2203/051* (2013.01)

(58) Field of Classification Search
CPC ....................... B81B 3/0062; B81B 2203/0136
See application file for complete search history.

(56) References Cited

U.S. PATENT DOCUMENTS

2002/0109894 A1* 8/2002 Clark ..................... G02B 26/06
359/224.1
2005/0091843 A1   5/2005 Yu
(Continued)

FOREIGN PATENT DOCUMENTS

EP   1288696 A1   3/2003
EP   1411024 A2   4/2004
(Continued)

OTHER PUBLICATIONS

Search Report for FR 1752155 dated Nov. 13, 2017.
(Continued)

*Primary Examiner* — Moazzam Hossain
(74) *Attorney, Agent, or Firm* — Pearne & Gordon LLP

(57) ABSTRACT

A microdevice (100) comprising a movable element (111) capable of moving relative to a fixed part (115), produced in first and second layers of material (104, 106) arranged one above the other such that the movable element comprises a portion (112) of the first layer and a portion (118) of the second layer secured to each other, and wherein the movable element is suspended from the fixed part by a suspension structure (121) formed in the first and/or second layer of material.

19 Claims, 11 Drawing Sheets

(56) References Cited

U.S. PATENT DOCUMENTS

| | | | |
|---|---|---|---|
| 2009/0283917 A1 | 11/2009 | Yu et al. | |
| 2011/0300658 A1 | 12/2011 | Yu | |
| 2014/0299947 A1 | 10/2014 | Jeanroy | |
| 2015/0353350 A1 | 12/2015 | Berthelot | |
| 2015/0375995 A1 | 12/2015 | Steimle et al. | |
| 2016/0004069 A1* | 1/2016 | Ozaki | A61B 3/1025 351/205 |
| 2016/0273916 A1* | 9/2016 | Jeanroy | B81B 3/0021 |
| 2017/0313573 A1* | 11/2017 | Montez | B81B 3/001 |
| 2018/0265348 A1 | 9/2018 | Berthelot et al. | |
| 2019/0011260 A1 | 1/2019 | Serge et al. | |

FOREIGN PATENT DOCUMENTS

| | | |
|---|---|---|
| EP | 2887013 A1 | 6/2015 |
| EP | 2952472 A2 | 12/2015 |

OTHER PUBLICATIONS

International Search Report for PCT/FR2018/050597 dated Jul. 12, 2018.

Written Opinion for PCT/FR2018/050597 dated Jul. 12, 2018.

Schofield, Adam et al. "Micromachined gyroscope concept allowing interchangeable operation both robust and precision modes" In: Sensors and Actuators A: Physical, Jun. 1, 2010, vol. 165, No. 1, pp. 35-42.

Xie, J. "Fabrication challenges and test structures for high-aspect-ratio SOI MEMS devices with refilled electrical isolation trenches", In: Microsyst Technol, 2015, vol. 21, pp. 1719-1727.

Zhu, Yong et al. "Fabrication of keyhole-free ultra-deep high-aspect-ratio isolation trench and its applications" In Journal of Micromechanics and Microengineering, 2005, No. 15, pp. 636-642.

Specification and drawings for U.S. Appl. No. 16/348,004, entitiled "Hinged Microelectromechanical and/or nanoelectromechanical device with out-of-plane movement", filed Sep. 11, 2017.

* cited by examiner

MICRODEVICE COMPRISING AT LEAST TWO MOVABLE ELEMENTS

CROSS-REFERENCE TO RELATED APPLICATIONS

This is a National Stage application of PCT international application PCT/FR2018/050597, filed on Mar. 14, 2018, which claims the priority of French Patent Application No. 17 52155, filed Mar. 16, 2017, both of which are incorporated herein by reference in their entireties.

TECHNICAL FIELD AND PRIOR ART

The invention relates to the field of microdevices, in particular that of the microdevices of the type microelectromechanical systems (MEMS) and/or nanoelectromechanical systems (NEMS) and/or micro-opto-electro-mechanical systems (MOEMS) and/or nano-opto-electro-mechanical systems (NOEMS), comprising mobile elements capable of moving under the effect of an outside action (mechanical, electric, magnetic) with respect to a fixed portion of the device. Hereinafter, the term "microdevice" is used to designate in particular a device of the MEMS and/or NEMS and/or MOEMS and/or NOEMS type.

Microdevices are generally made by the implementation of conventional techniques of collective etching of a plate of semiconductor material (for example of silicon). They are small and not costly to manufacture. The fields of uses can be highly varied, ranging from consumer goods to fields of very specific uses.

Some microdevices each comprise a plurality of mobile elements, for example such as some inertial sensors which require a plurality of mobile masses in order to carry out inertial measurements. One of the fields of use of these sensors is for example the inertial measurement of angular values such as angular position (gyroscopes) and speed of rotation (pyrometers). The performance of such an inertial sensor depends directly on the balancing of the resonator, and more particularly on the balancing among the various mobile masses of the sensor. This requires the presence of at least two mobile masses mounted symmetrically one with respect to the other in such a way that they can move in phase opposition with respect to one another, thus providing balancing of the sensor.

These mobile masses can be made side by side in the same layer of material, as is described in the documents US2014/0299947A1 and EP 2 887 013 A1. However, such a sensor of angular value comprising two mobile masses arranged side by side and made in the same layer of material has the disadvantage of engendering a dynamic unbalance resulting from the movement of the overall centre of gravity of the mobile masses at their frequency of vibration. This causes forces of reaction in the support and thus a loss of energy of the vibration. Moreover, the presence of the mobile masses side by side means, for the sensor, significant dimensions and thus a significant production cost.

Alternatively, it is also known to make, in the same layer of material, concentric mobile masses. However, the main disadvantage of the presence of at least two concentric mobile masses made in the same layer is that these two masses cannot have identical shapes. This configuration can lead to problems of balancing of these masses. Moreover, the concentric fabrication of these mobile masses means, for the sensor, significant dimensions, and thus a significant production cost. These significant dimensions are also found even when a single mobile mass is made in a single layer of material.

Another configuration involves making the two mobile masses of a sensor one above the other, each in a different layer of material. This configuration allows to prevent the problems encountered with the configurations described above in which the mobile masses are arranged side by side or concentrically. However, the fabrication of such sensors poses other problems.

Thus, the document US 2011/0300658 A1 describes the fabrication of such a sensor comprising two superimposed mobile masses, from an SOI double substrate, that is to say, comprising, above a support layer and a buried dielectric layer, two superficial layers of silicon superimposed one above the other and spaced apart from one another by another dielectric layer. The disadvantage of such a fabrication method is that the two mobile masses must be made during the same step of etching of the two superficial layers of silicon. The two mobile masses made are thus necessarily identical. Moreover, the multilayer etching that must be carried out through the silicon/dielectric/silicon stack in a single technological step is not easy to implement. This method is not therefore adapted to the fabrication of a sensor comprising two superimposed mobile masses having a different geometry.

In the documents US 2005/0091843 A1 and US 2009/0283917 A1, it is proposed to form a sensor comprising two mobile masses made in two distinct substrates. A sealing of the two substrates is then carried out in order to superimpose the two mobile masses made and obtain the sensor. With this method, the mobile masses of the sensor can be similar or not. However, a disadvantage of this method is that the sealing between the two substrates requires carrying out an alignment of the two substrates with respect to one another. This step of alignment is very sensitive and difficult to implement, and a misalignment between the two substrates can lead in particular to a misalignment of the two centres of gravity of the superimposed mobile masses, which can compromise the balancing of the sensor.

The document US 2015/0375995 A1 describes the fabrication of a first mobile element of a sensor in a substrate, then the sealing of a cover covering the first mobile element, then a thinning of the portion of the substrate used as a mechanical handle (at the rear face of the substrate), and finally the fabrication of a second mobile element in this thinned portion of the substrate from its rear face. This method allows the fabrication of mobile elements that are similar or not. However, it is necessary to carry out a sealing with alignment of the substrate and of the cover. Moreover, the alignment of the second mobile element with respect to the first mobile element poses problems since the alignment marks arranged on the rear face of the substrate and used for the alignment of the cover disappear during the thinning of the portion of the substrate used as a mechanical handle. The alignment of the second mobile element must therefore be carried out either by using infrared vision of the elements, or by carrying out the alignment with respect to the transferred cover. In both cases, this can lead to significant misalignment between the two mobile elements.

DESCRIPTION OF THE INVENTION

An aim of the present invention is to propose a microdevice, for example of the inertial sensor type, comprising at least one mobile element and not having at least a portion of the disadvantages of the microdevices of the prior art, that is to say, limiting or eliminating the effect of dynamic unbalance, which eliminates the alignment constraints encountered during the fabrication of the microdevices of the prior art, and which can be made in a compact manner with a reduced cost.

For this, the present invention proposes a microdevice comprising at least:
- a first layer of material;
- a second layer of material;
- a fixed portion;
- a first mobile element comprising at least a first portion of the first layer of material and at least a second portion of the second layer of material;
- first suspension means formed in the first layer of material and/or in the second layer of material;

and wherein:
- the first mobile element is capable of moving with respect to the fixed portion;
- the first and second layers of material are arranged one above the other;
- the first portion of the first layer of material is rigidly connected to the second portion of the second layer of material;
- the first mobile element is suspended from the fixed portion by the first suspension means.

This distribution of the portions of material forming the mobile element inside the various layers of material avoids leading to a significant dynamic unbalance resulting from the movement of the overall centre of gravity of the microdevice.

The features of this microdevice are compatible with a fabrication not involving the implementation of an alignment of elements intended to be sealed to one another. This microdevice can thus be made without having to implement such an alignment.

The fabrication of a mobile element in two superimposed layers further allows to reduce the bulk of this mobile element.

When the mobile element comprises various portions coming from two distinct layers electrically insulated from one another, a plurality of different electric potentials can be applied to this mobile element.

In general, the expression "layer of material" can designate a monolithic layer of material or a set of a plurality of superimposed layer.

The microdevice may further comprise:
- a second mobile element comprising at least a first portion of the second layer of material and/or at least a second portion of the first layer of material;
- second suspension means formed in the first layer of material and/or in the second layer of material;

and wherein:
- the first and second mobile elements may be capable of moving with respect to one another and with respect to the fixed portion;
- the second mobile element may be suspended from the fixed portion by the second suspension means;
- when the second mobile element comprises the first portion of the second layer of material and the second portion of the first layer of material, the first portion of the second layer of material may be rigidly connected to the second portion of the first layer of material.

The second portions of the first and second layers of material may correspond to simple portions of these layers, for example having a rectangular shape, or may have a more complex geometry, for example forming a frame, a plurality of studs, a grid, etc.

This microdevice may thus comprise a fixed portion from which at least two superimposed mobile elements are suspended. The distribution of the portions of material forming the mobile elements in the two layers of material may correspond to a top-to-tail positioning of the mobile elements. These mobile elements may thus be arranged in an interlocking manner with respect to one another in the microdevice.

The mobile elements may be made in layers of material superimposed one above the other. This reduces the bulk of the microdevice with respect to those in which the mobile elements are made in the same layer of material, either one next to the other or concentrically, which leads to a lesser production cost. This advantage is also found when the microdevice only comprises a single mobile element.

Moreover, such a microdevice does not have any constraints limiting the shape and the dimensions of the mobile elements which can be similar or not for each of the mobile elements. When the shape and the dimensions of the mobile elements are similar, this facilitates the balancing of the microdevice.

Advantageously, the first and second mobile elements may be capable of moving substantially in phase opposition with respect to one another, for example when the microdevice is subjected to an outside action (movement, acceleration, rotation, impact, etc.). In this case, the distribution of the portions of material forming each of the mobile elements in the two layers is very advantageous since the dynamic unbalance which could be caused by such a movement is reduced.

The first and second mobile elements may be capable of moving substantially in phase with respect to one another.

The centres of gravity of the first and second mobile elements may be aligned one above the other according to an axis substantially perpendicular to main faces of the first and second layers of material. This advantageous configuration reduces even more the effects of overall dynamic unbalance, or even eliminates them.

The first and second mobile elements may be symmetrical with respect to a centre of symmetry located between the first portions of the first and second layers of material and on the axis substantially perpendicular to the main faces of the first and second layers of material.

The microdevice may be such that:
- at least a first end of the first portion of the first layer of material is connected to the second portion of the second layer of material and at least a second end of the first portion of the first layer of material forms a free end of the first mobile element, and
- at least a first end of the first portion of the second layer of material is connected to the second portion of the first layer of material and at least a second end of the first portion of the second layer of material forms a free end of the second mobile element.

In this case, the second end of the first portion of the first layer of material may be arranged between the first end of the first portion of the first layer of material and the second portion of the first layer of material, and the second end of the first portion of the second layer of material may be arranged between the first end of the first portion of the second layer of material and the second portion of the second layer of material.

The first and second mobile elements may be arranged in an interlocking and/or concentric manner with respect to one another.

The first portion of the first layer of material may be connected to the second portion of the second layer of material by means of at least a first portion of an intermediate layer arranged between the first and second layers of material, and/or the first portion of the second layer of material may be connected to the second portion of the first layer of material by means of at least a second portion of the intermediate layer.

The microdevice may further comprise elements for detection and/or measurement of a movement of the first mobile element and/or of the second mobile element with respect to the fixed portion and/or of a movement of the first mobile element with respect to the second mobile element, and/or elements capable of moving the first mobile element and/or the second mobile element with respect to the fixed portion and/or moving the first mobile element with respect to the second mobile element.

In an advantageous configuration, the first mobile element may form a first detection element, and the second mobile element may form a second detection element, wherein the first and second detection elements may be capable of carrying out an inertial measurement of angular values to which the microdevice is subjected.

The first mobile element and/or the second mobile element may be capable of moving in translation and/or in rotation with respect to the fixed portion and/or with respect to one another.

The fixed portion may comprise portions of the first and second layers of material arranged around the first and second mobile elements and/or surrounded by the first and second mobile elements.

The fixed portion may comprise a support layer such that the first layer of material is arranged between the support layer and the second layer of material.

According to a specific embodiment, the microdevice may further comprise at least one intermediate mobile element suspended from the fixed portion and capable of moving with respect to the fixed portion, and the first and second mobile elements may be suspended from the intermediate mobile element and be capable of moving with respect to the intermediate mobile element and the fixed portion.

In this specific embodiment, the intermediate mobile element provides an absorption of the vibrations exterior to the microdevice. Thus, the mobile elements do not undergo these exterior vibrations.

Moreover, the microdevice according to this specific embodiment may be such that:
 the fixed portion comprises a fixed frame at least partially surrounding the intermediate mobile element, and the intermediate mobile element forms a mobile frame suspended from the fixed frame, and/or
 the microdevice further comprises a first cavity, at least a portion of the walls of which is formed by the fixed portion and in which the intermediate mobile element is encapsulated, and a second cavity arranged in the first cavity, at least a portion of the walls of which is formed by the intermediate mobile element and in which the first and second mobile elements are encapsulated.

Advantageously, the second cavity may be insulated from the first cavity.

Thus, it is possible to encapsulate the first and second mobile elements in a specific atmosphere (in terms of nature of gas and/or pressure) different than that in which the intermediate mobile element is located, for example different than the ambient air in which the microdevice is located. The second cavity may be hermetically or impermeably sealed with respect to the first cavity.

The invention also relates to a method for fabricating a microdevice, comprising at least:
 etching of a first layer of material such that at least a first portion of the first layer of material forms a first portion of at least a first mobile element;
 fabrication of a second layer of material on the first layer of material;
 etching of the second layer of material such that at least a second portion of the second layer of material forms a second portion of the first mobile element and is rigidly connected to the first portion of the first layer of material;
these steps being implemented such that the first mobile element is suspended from a fixed portion by first suspension means formed in the first layer of material and/or in the second layer of material, the first mobile element being capable of moving with respect to the fixed portion.

Advantageously, the method may be such that:
 the etching of the first layer of material is implemented such that at least a second portion of the first layer of material forms a first portion of at least a second mobile element;
 the etching of the second layer of material is implemented such that at least a first portion of the second layer of material forms a second portion of the second mobile element and is rigidly connected to the second portion of the first layer of material;
 the steps of the method are implemented such that the second mobile element is suspended from the fixed portion by second suspension means formed in the first layer of material and/or in the second layer of material, the first and second mobile elements being capable of moving with respect to one another and with respect to the fixed portion.

The fabrication of the second layer of material on the first layer of material may comprise a transfer of the second layer of material onto the first layer of material such that an intermediate layer is arranged between the first and second layers of material, the method being capable of further comprising, after the etching of the second layer of material, an etching of the intermediate layer such that at least a first portion of the intermediate layer connects the first portion of the first layer of material to the second portion of the second layer of material and, when the second mobile element is made, at least a second portion of the intermediate layer connects the first portion of the second layer of material to the second portion of the first layer of material.

According to a first embodiment, a sacrificial layer may be arranged between the first layer of material and a support layer, the method being capable of further comprising, after the etching of the second layer of material, the fabrication of an access to the sacrificial layer through the support layer then an etching of a portion of the sacrificial layer via the access formed through the support layer, releasing at least the first portion of the first layer of material (and also the second portion of the first layer of material when the second mobile element is made) with respect to the support layer. In this case, the releasing of the first mobile element (and of the second mobile element when the latter is made) may be carried out from two opposite faces of the microdevice.

According to a second embodiment, a sacrificial layer may be arranged between the first layer of material and a support layer, the method being capable of further comprising, between the etching of the first layer of material and the fabrication of the second layer of material, an etching of a first portion of the sacrificial layer partially releasing at least the first portion of the first layer of material (and the second portion of the first layer of material when the second mobile element is made) with respect to the support layer, and after the etching of the second layer of material, an etching of a second portion of the sacrificial layer via openings formed through the first and second layers of material during the previous etchings of the first and second layers of material, completing the releasing of the first portion of the first layer of material (and of the second portion of the first layer of material when the second mobile element is made) with respect to the support layer. In this case, the releasing of the first mobile element, and optionally of the second mobile element, may be carried out without having to form an access to the sacrificial layer from a rear face of the support layer, and only from a front face of the microdevice.

The steps of etching of the first and second layers of material may form releasing holes passing through the first and second layers of material and which are aligned above each other. Thus, the realising of the first portion (and optionally of the second portion) of the first layer of material may be carried out by using etching agents reaching the sacrificial layer via these releasing holes.

The step of etching of the second layer of material may form additional releasing holes passing through the second layer of material. This configuration allows in particular to obtain different mobilities of the mobile elements with respect to one another, when a plurality of mobile elements are made.

BRIEF DESCRIPTION OF THE DRAWINGS

The present invention will be better understood upon reading the description of examples of realisation given purely for informational purposes and in no way limiting while referring to the appended drawings in which.

Figure 1:
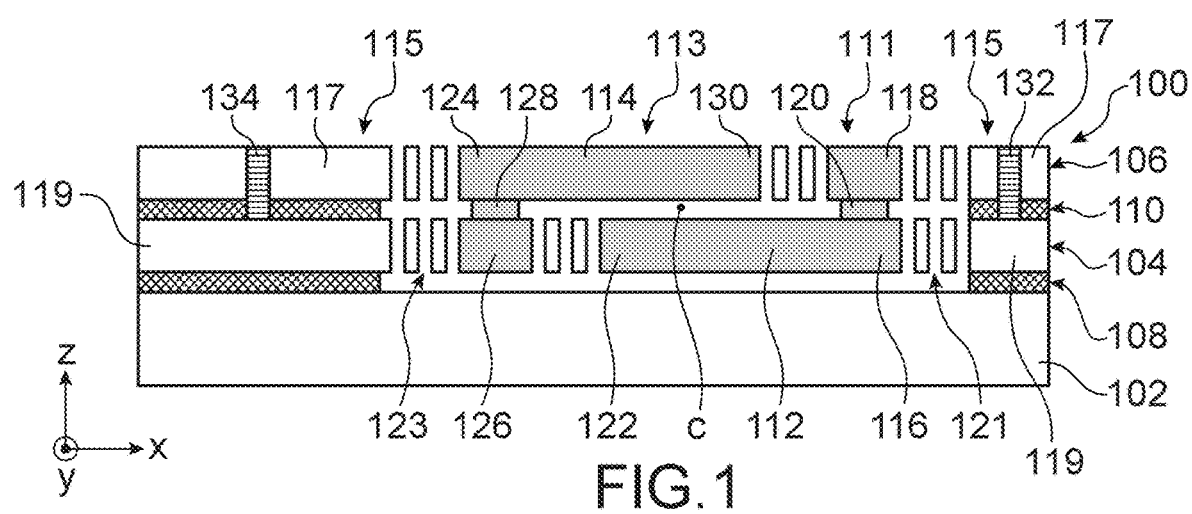
FIG. 1 schematically shows a microdevice, subject-matter of the present invention, according to a specific embodiment.

Identical, similar or equivalent portions of the various drawings described below have the same numerical references so as to facilitate the passage from one drawing to another.

The various portions shown in the drawings are not necessarily on a uniform scale, in order to make the drawings more readable.

The various possibilities (alternatives and embodiments) must be understood as not being mutually exclusive and can be combined with each other.

DETAILED DESCRIPTION OF SPECIFIC EMBODIMENTS

Reference is made first of all to FIG. 1 which schematically shows a microdevice 100 according to a specific embodiment.

The microdevice 100 is made from a stack comprising a support layer 102, a first layer of material 104 and a second layer of material 106, the first layer 104 being arranged between the support layer 102 and the second layer 106. In the specific embodiment described here, the material of the first and second layers 104, 106 is a semiconductor, for example silicon that is doped or not, germanium that is doped or not, SiGe, etc.

A layer 108, named sacrificial layer, is arranged between the support layer 102 and the first layer 104. Moreover, a layer 110, named intermediate layer, is arranged between the first layer 104 and the second layer 106. In the specific embodiment described here, the layers 108, 110 each comprise a dielectric material, for example $SiO_2$. In general, the materials of the layers 108, 110 are such that they can be etched selectively with respect to the materials of the first and second layers 104, 106.

The microdevice 100 shown in FIG. 1 corresponds to an inertial sensor comprising a first mobile element 111 formed by a first portion 112 of the first layer 104 and a second portion 118 of the second layer 106, and a second mobile element 113 formed by a first portion 114 of the second layer 106 and a second portion 126 of the first layer 104.

The first portion 112 of the first layer 104 comprises a first end 116 connected, or rigidly connected, to the second portion 118 of the second layer 106 by means of a first portion 120 of the intermediate layer 110. The first portion 120 of the intermediate layer 110 is part of the first mobile element 111. The first portion 112 comprises a second end 122 forming a free end of the first mobile element 111, that is to say, an end that is not in contact with a portion of the intermediate layer 110.

The first portion 114 of the second layer 106 comprises a first end 124 connected to the second portion 126 of the first layer 104 by means of a second portion 128 of the intermediate layer 110 that is part of the second mobile element 113. The first portion 114 of the second layer 106 comprises a second end 130 forming a free end of the second mobile element 112.

In this microdevice 100, the first and second mobile elements 111, 113 form mobile masses, or seismic masses, capable of moving with respect to a fixed portion 115 of the microdevice 100. The fixed portion 115 comprises portions 117, 119 of the first and second layers 104, 106 from which the mobile elements 111, 113 are suspended respectively by means of first and second suspension means 121, 123. In the specific embodiment shown in FIG. 1, these first and second suspension means 121, 123 correspond to portions of the first and second layers of material 104, 106 forming microbeams suspending the portions 112, 114, 118 and 126 of the mobile elements 111, 113 from the portions 117, 119 of the first and second layers of material 104, 106. The fixed portion 115 also includes the support layer 102.

Alternatively, it is possible for the suspension means 121, 123 to only be formed by portions of a single one of the two layers of material 104, 106. For example, one or each of the mobile elements 111, 113 may be suspended from the fixed portion 115 by microbeams connected only to the first portion 112, 114, or to the second portion 118, 126.

Each of the mobile elements 111, 113 is formed by a portion of one of the layers 104, 106 connected to a portion of the other of the layers 104, 106, the two mobile elements 111, 113 being arranged in an interlocking manner with respect to one another.

In the specific embodiment described in relation to FIG. 1, these two detection elements corresponding to the two mobile elements 111, 113 are identical with respect to one another and arranged top to tail with respect to one another, that is to say, are symmetrical with respect to a centre of symmetry C located between the first portions 112, 114 of the first and second layers 104, 106. In the embodiment described in relation to FIG. 1, the second end 122 of the first portion 112 of the first layer 104 is arranged between the first end 116 of the first portion 112 of the first layer 104 and the second portion 126 of the first layer 104, and the second end 130 of the first portion 114 of the second layer 106 is arranged between the first end 124 of the first portion 114 of the second layer 106 and the second portion 118 of the second layer 106.

In this specific embodiment, the centres of gravity of the first and second mobile elements 111, 113 are aligned one above the other according to an axis substantially perpendicular to main faces of the first and second layers of material 104, 106 (faces parallel to the plane (X,Y)), that is to say here, aligned according to an axis parallel to the axis Z and passing through the centre of symmetry C.

Thus, when the microdevice 100 is subjected to outside forces, the movement in phase opposition of the first and second mobile elements 111, 113 does not lead to or leads to little dynamic unbalance.

Alternatively, it is possible for these mobile elements 111, 113 to be different from one another, that is to say, for them to not have the same shape and/or the same dimensions.

Finally, the microdevice 100 comprises here electrically conductive vias 132, 134 electrically connecting the first and second layers 104, 106 to each other.

Portions of material of at least one of the layers 104, 106 may also connect the first mobile element 111 to the second mobile element 113. Such portions can thus ensure a mechanical retention of the first portions 112, 114. However, these portions of material, which correspond for example to microbeams, are such that the mobile elements 111, 113 are mobile with respect to one another.

FIGS. 2A to 2M show the steps of a method for fabricating a microdevice 100 according to a first embodiment.

The microdevice 100 is for example made from a first substrate of the semiconductor-on-insulator type, for example SOI (silicon on insulator), SiGeOI, GeOI, etc. This substrate, shown in FIG. 2A, comprises the support layer 102, a buried dielectric layer, or BOX ("Buried Oxide"), forming the sacrificial layer 108 and comprising for example semiconductor oxide such as $SiO_2$, and a superficial layer of semiconductor comprising for example silicon and forming the first layer of material 104. The thickness of each of the layers 104 and 108 is for example between approximately 100 nm and 400 µm, or even greater than 400 µm. For example, the thickness of the layer 104 is typically equal to approximately 60 µm, and that of the layer 108 equal to approximately 2 µm. In general, the first layer 104 corresponds to a layer of material adapted to the fabrication of one of the mobile elements of the microdevice 100, and the material of the sacrificial layer 108 is capable of being etched selectively with respect to that of the first layer 104.

Alternatively, the microdevice 100 may be made from a massive, or bulk, substrate, comprising for example a semiconductor such as silicon and forming the support layer 102, on which are successively deposited the sacrificial layer 108, for example dielectric such as a layer of oxide of semiconductor or glass, and the first layer of material 104 in which one of the mobile elements of the microdevice 100 is intended to be made, corresponding for example to a layer of semiconductor such as silicon that is doped or not, germanium that is doped or not, etc. The sacrificial layer 108 and the first layer of material 104 may be formed by implementing various techniques such as depositions of the type LPCVD (low pressure chemical vapour deposition), PECVD (plasma-enhanced chemical vapour deposition), ALD (atomic layer deposition), PVD (physical vapour deposition), or via epitaxy, etc.

Figure 2A:
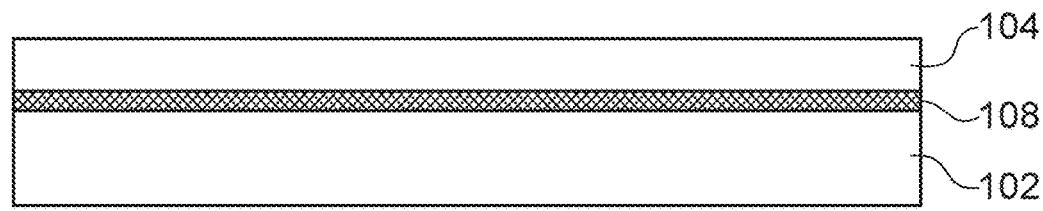
FIGS. 2A to 2M show the steps of a method for fabricating a microdevice, subject-matter of the present invention, according to a first embodiment.
Figure 2B:
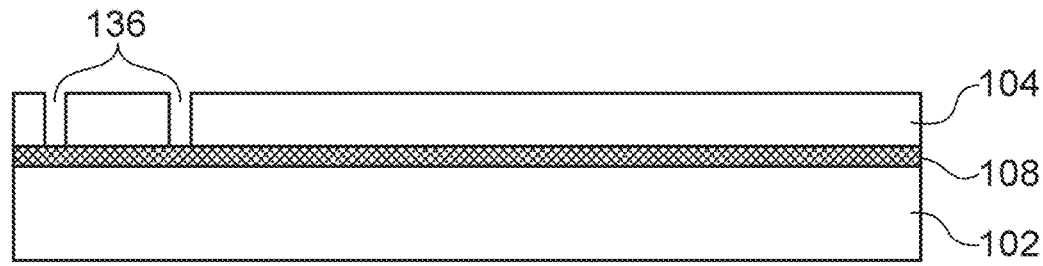

When various regions of the first layer of material 104 are intended to be subjected to different electric potentials, the first layer 104 may be structured in such a way as to define one or more electric-insulation trenches 136 between these various zones of the first layer 104 (FIG. 2B). For example, an etching of the DRIE type (deep reactive-ion etching) may be implemented in order to form these trenches 136, such an etching allowing a very selective and deep etching of the semiconductor (silicon here) of the first layer 104, the sacrificial layer 108 acting as a stop layer for this etching.

Figure 2C:
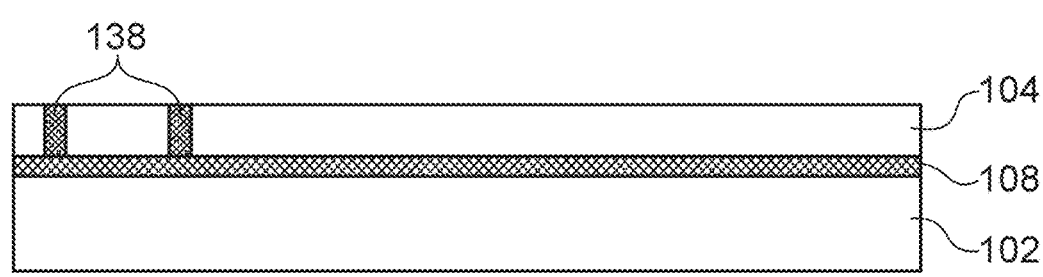

This or these trenches 136 may then be plugged or not by at least one dielectric material 138 (FIG. 2C). This dielectric material 138 may be for example a thermal oxide, a nitride, non-doped polysilicon, or a combination of various dielectric materials. The filling of these trenches 136 by the dielectric material 138 allows to obtain a better mechanical strength of the mobile structure having zones of different electric potentials which will be made in the first layer 104. The documents "Fabrication challenges and test structures for high-aspect-ratio SOI MEMS devices with refilled electrical isolation trenches" from J. Xie, Microsyst. Technol. (2015) 21:1719-1727, and "Fabrication of keyhole-free ultra-deep high-aspect-ratio isolation trench and its applications" from Y. Zhu et al., J. Micromech. Microeng. 15 (2005), 636-642, describe the fabrication of such trenches filled with dielectric material. If the trenches 136 are not then plugged by the dielectric material 138, they can be made later, for example at the same time as the structuring of the first layer 104 forming the portions 112 and 126 of the mobile elements 111, 113 of the microdevice 100 (see the step described below in relation to FIG. 2D).

Alternatively, it is possible to not make the trenches 136 if the microdevice 100 does not need to have, in the first layer 104, various zones electrically insulated from each other.

Figure 2D:
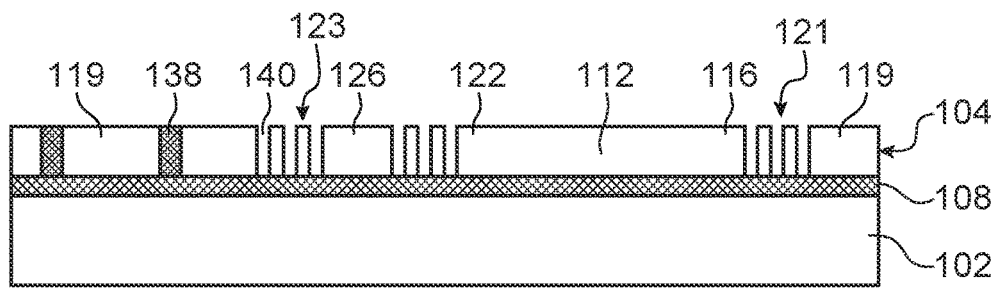

The first layer of material 104 is then structured, here by etching (for example DRIE) in such a way as to define the first portion 112 intended to be part of the first mobile element 111 and the second portion 126 intended to be part of the second mobile element 113 (FIG. 2D). A portion of the suspension means 121, 123 (those intended to maintain the portions 112 and 126 in a suspended state with respect to the portions 119) are also made in the first layer 104, as well as the portions 119 of the fixed portion 115 of the microdevice 100. Elements for detection and/or measurement of the movement of one of or of the mobile elements 111, 113, for example electrostatic combs, may also be made in the first layer 104. According to the nature of the microdevice 100, it is also possible for this structuring of the first layer 104 to form elements capable of moving, that is to say actuation means, the or one of the mobile elements 111, 113. Finally, releasing holes 140 intended for the later releasing of the portions 112, 126 with respect to the support layer 102 are also made through the first layer 104. These releasing holes 140 are used during the etching of the sacrificial layer 108 which will be implemented in order to release the portions 112, 126 with respect to the support layer 102.

The second layer of material 106 is then made on the first layer of material 104. In the first embodiment described here, the second layer 106 corresponds to the superficial layer of a second substrate of the type semiconductor on insulator, for example SOI, SiGeOI, GeOI, etc. This second substrate comprises a bulk layer 142 and a buried dielectric layer 144 arranged between the bulk layer 142 and the second layer of material 106.

This second substrate can be transferred onto the first layer of material 104 according to various techniques: direct bonding between the first layer 104 and the second layer 106 (silicon/silicon direct bonding for example, or more generally semiconductor/semiconductor), or direct bonding between one of the first and second layers 104, 106 and a dielectric layer previously formed on the other of the first and second layers 104, 106 (semiconductor/dielectric direct bonding, for example silicon/SiO$_2$), or direct bonding between two dielectric layers previously formed on each of the first and second layers 104, 106 (dielectric/dielectric direct bonding, for example SiO$_2$/SiO$_2$). Alternatively, this rigid connection between the first and second layers 104, 106 may be made by metal sealing (for example of the type Au/Si, Au/Au, Au/Sn, Al/Ge, etc.) by previously forming, on at least one of the two layers 104, 106, such a layer or metal bead. A rigid connection of the two layers 104, 106 may also be made by means of a non-metallic sealing bead, for example polymer.

Figure 2E:
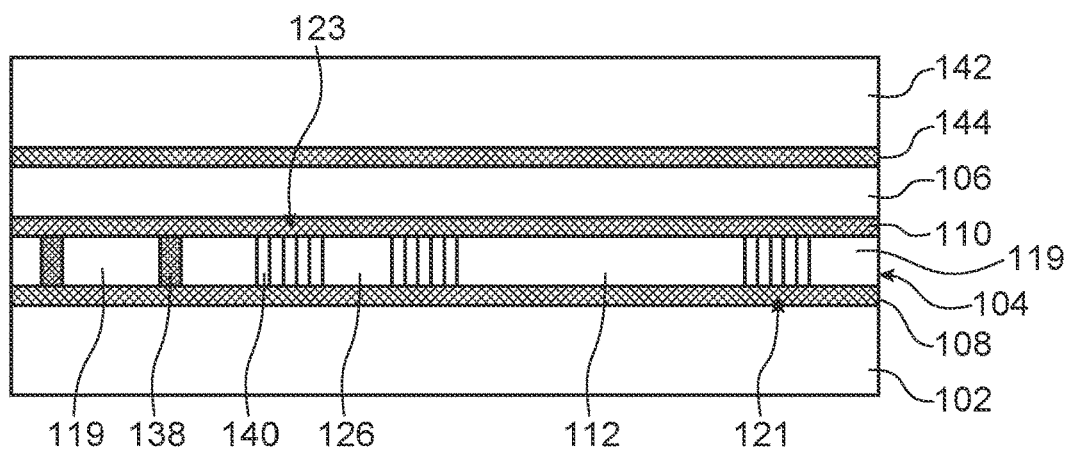

In the example of FIG. 2E, dielectric/dielectric or semiconductor/dielectric direct bonding is implemented in order to rigidly connect the two layers 104, 106. An intermediate layer 110, comprising a dielectric material such as SiO$_2$, is present between the layers 104, 106.

Figure 2F:
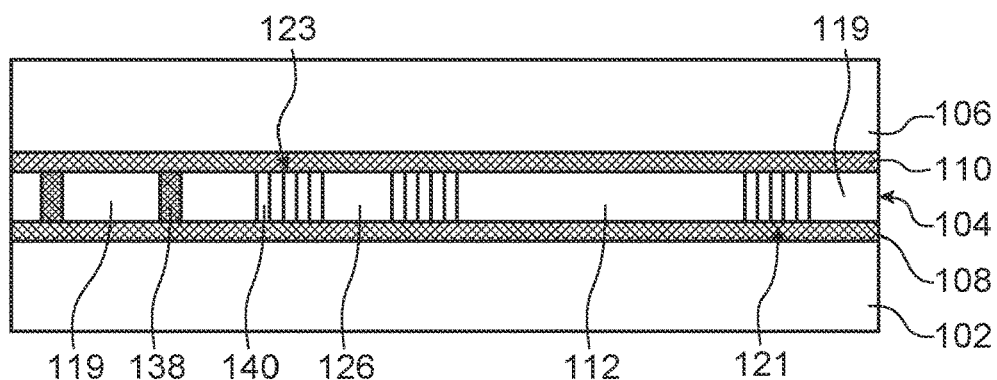

Alternatively, the second layer of material 106 may not be the superficial layer of a substrate of the semiconductor-on-insulator type, but be a simple layer of material, for example of semiconductor, deposited on the first layer 104, optionally with the presence of the intermediate layer 110 between the layers 104, 106. FIG. 2F shows such an alternative, in which the second layer 106 and the intermediate layer 110 are deposited for example by LPCVD, PECVD, ALD, PVD, epitaxy, etc.

Figure 2G:
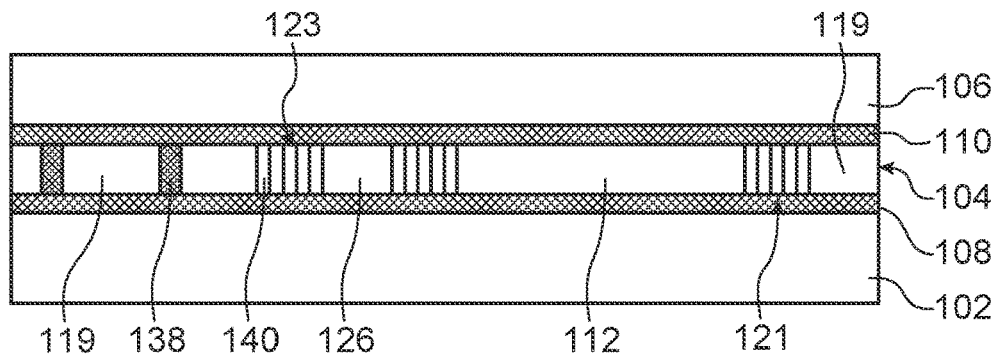

As shown in FIG. 2G, the layers 142 and 144 are removed. The second layer 106 is optionally thinned to the desired thickness. When the second layer 106 is made directly by deposition, this thinning is generally implemented because of the thickness of material deposited which does not generally correspond to the desired thickness of the second mobile element 114. The thickness of the second layer 106 may be between approximately 100 nm and 400 μm, or even greater than approximately 400 μm, and for example equal to approximately 60 μm. The thickness of the second layer 106 is equal or not to that of the first layer 104.

Figure 2H:
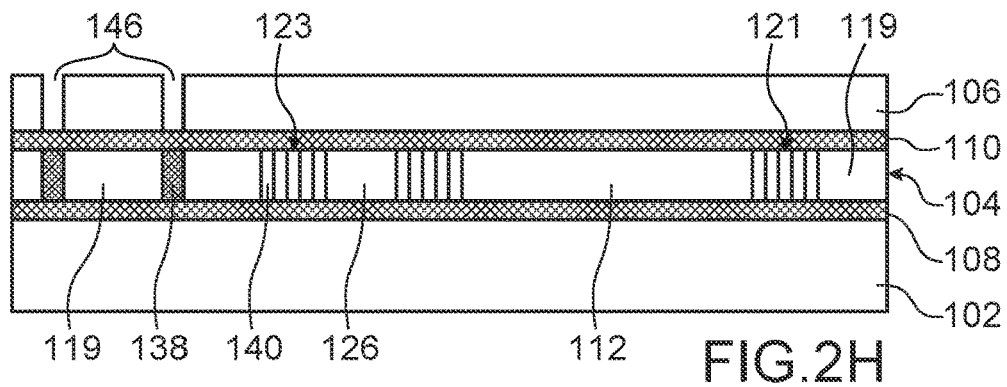

As described above for the first layer 104, when various regions of the second layer of material 106 are intended to be subjected to different electric potentials, the second layer 106 may be structured in such a way as to define one or more electric-insulation trenches 146 between these various zones of the second layer 106 (FIG. 2H). For example, an etching of the DRIE type may be implemented in order to form these trenches 146, the intermediate layer 110 acting as a stop layer here.

Figure 2I:
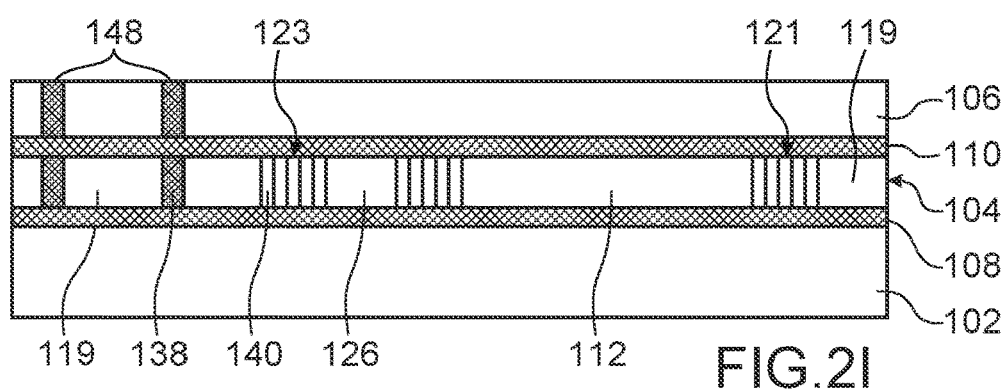

This or these trenches 146 may then be plugged or not by at least one dielectric material 148 (FIG. 2I). This dielectric material 148 may be for example one of the materials previously mentioned for the dielectric material 138. If the trenches 146 are not plugged by the dielectric material 148, they can be made later, for example at the same time as the structuring of the second layer 106 forming the other portions 114, 118 of the mobile elements 111, 113 of the microdevice 100 (see the step described below in relation to FIG. 2K).

Figure 2J:
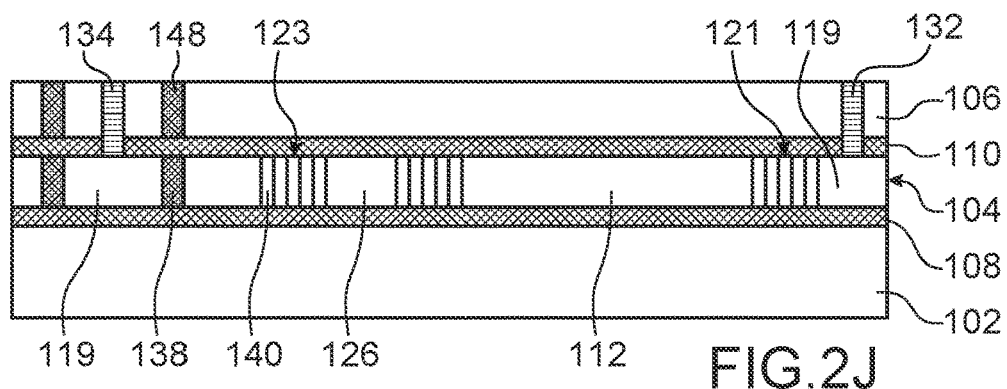

The two layers 104 and 106 may be electrically connected by fabricating one or more interconnection vias 132, 134 between these two layers (FIG. 2J). This or these vias 132, 134 are made by the successive etching of the layers 106 and 110 with a stoppage on the first layer 104. This or these vias are then filled by an electrically conductive material (for example a metal material such as Al, W, Cu, Au, or a doped semiconductor such as Si or Ge).

Figure 2K:
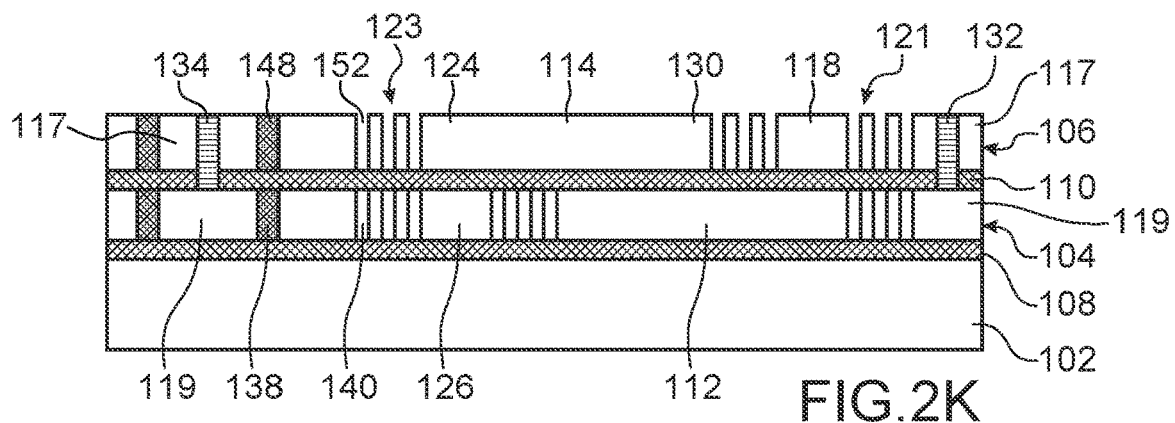

The second layer 106 is then structured, for example by etching, in such a way as to define the portions 114, 118 of the mobile elements 111, 113, as well as the portions 117 of the fixed portion 115 and the means 121, 123 for suspension of the portions 114, 118 with respect to the portions 117 (FIG. 2K). Elements for detection and/or measurement of the movement of one of or of the mobile elements 111, 113, for example electrostatic combs, may also be formed in the second layer 106. According to the nature of the microdevice 100, it is also possible for this structuring of the second layer 106 to form elements capable of moving the or one of the mobile elements 111, 113, that is to say actuation means. Finally, releasing holes 152 intended for the later releasing of the portions 114, 118 with respect to the intermediate layer 110 are also made through the second layer 106. These releasing holes 152 are used during the etching of the intermediate layer 110 which will be implemented in order to release these portions 114, 118.

Figure 2L:
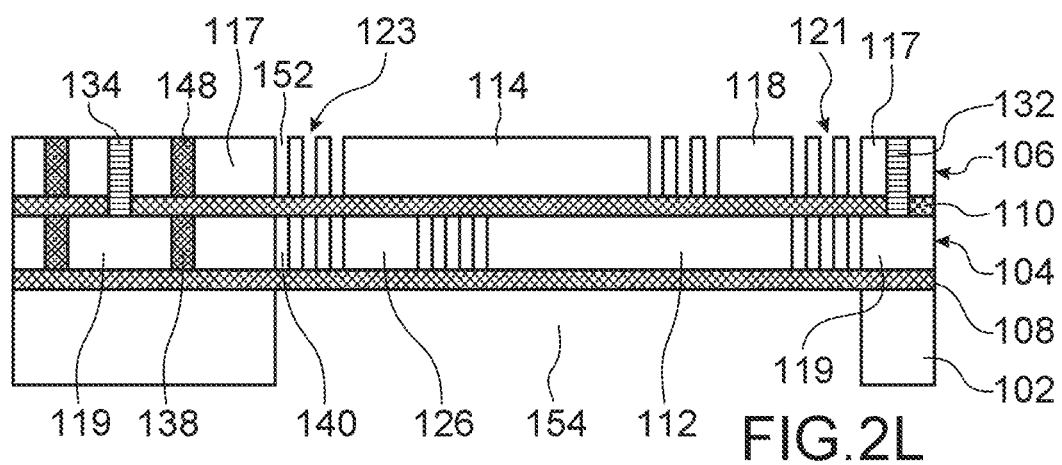

As shown in FIG. 2L, an etching of a portion of the support layer 102, from its rear face, is then implemented, forming an access 154 to the sacrificial layer 108. This access 154 is located facing the portions 112, 126.

Figure 2M:
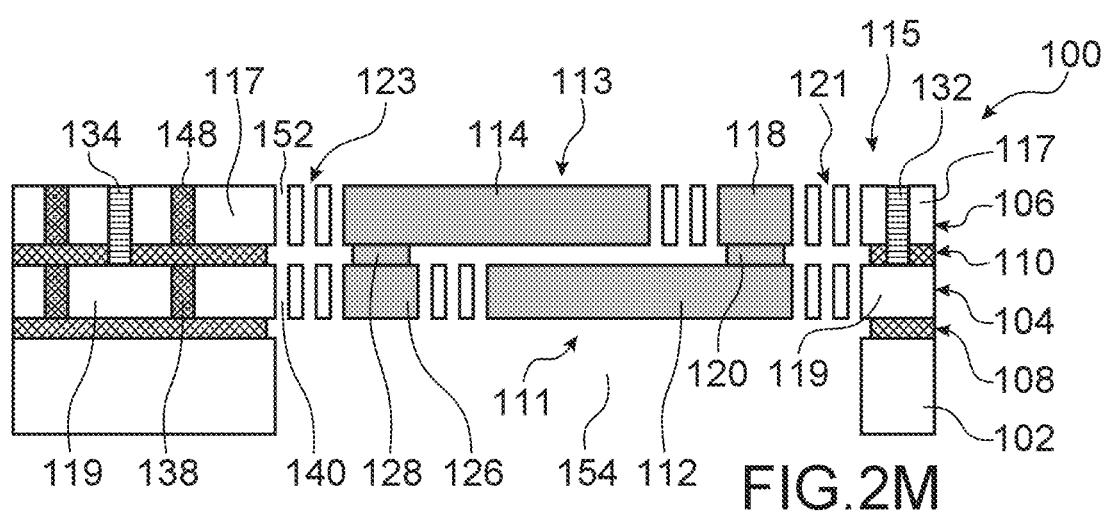

The mobile elements 111, 113 are then released via a selective removal of the materials of the layers 108, 110 (dielectrics) with respect to the other materials of the layers 102, 104, 106 (semiconductors), as shown in FIG. 2M. Portions 120, 128 of the intermediate layer 110 are preserved, these portions ensuring the link between the first portions 112, 114 and the second portions 118, 126.

All the etchings of the first and second layers 104, 106 implemented (previously described in relation to FIGS. 2B, 2D, 2H, 2J and 2K) during this method are advantageously implemented while using alignment marks, or alignment reference frames, present on the rear face of the support layer 102 (the one on the side opposite to that where the sacrificial layer 108 is located), preferably on a portion of this rear face which will not be etched in order to form the access 154. Because these alignment marks are preserved until the releasing of the mobile elements 111, 113, they can be used to fabricate these mobile elements 111, 113 in an aligned manner with respect to one another. The alignment with respect to such marks may be carried out, for example, with optical or interference systems routinely used in photolithography equipment.

Alternatively, it is possible for the access 154 to not be formed by etching the entire portion of the support layer 102 that is located facing the portions 112 and 126, but by forming releasing holes through this portion of the support layer 102

The microdevice 100 described above comprises two detection elements, each comprising at least one mobile element formed from two portions of the layers 104, 106, made in an interlocking manner one above the other. Alternatively, the microdevice 100 may comprise a greater number of detection elements, or mobile elements, made in an interlocking manner above each other. For this, the steps described above in relation to FIGS. 2E to 2K are in this case repeated one or more times before carrying out the releasing of the mobile elements of these superimposed elements.

FIGS. 3A to 3H show the steps of a method for fabricating a microdevice 100 according to a second embodiment.

Figure 3A:
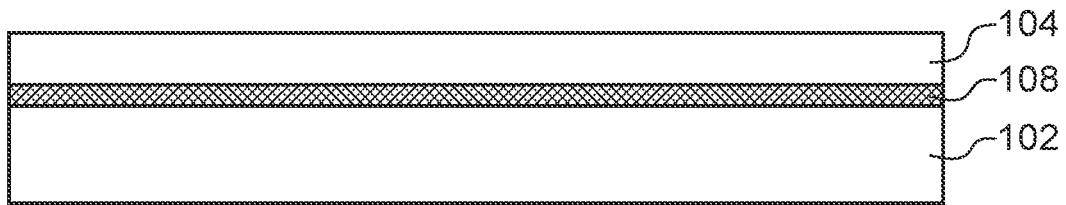
FIGS. 3A to 3H show the steps of a method for fabricating a microdevice, subject-matter of the present invention, according to a second embodiment, FIG. 4 schematically shows a microdevice, subject-matter of the present invention, according to another specific embodiment.

Like in the first embodiment, the method is implemented starting from a stack of layers comprising the support layer 102, the sacrificial layer 108 and the first layer of material 104 (FIG. 3A).

Figure 3B:
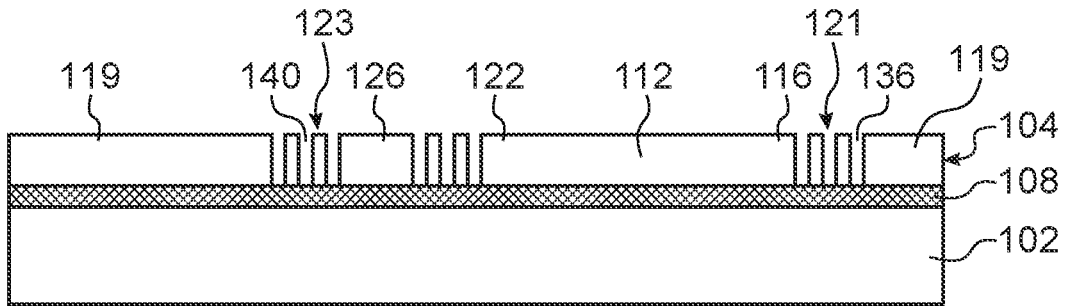
Figure 3C:
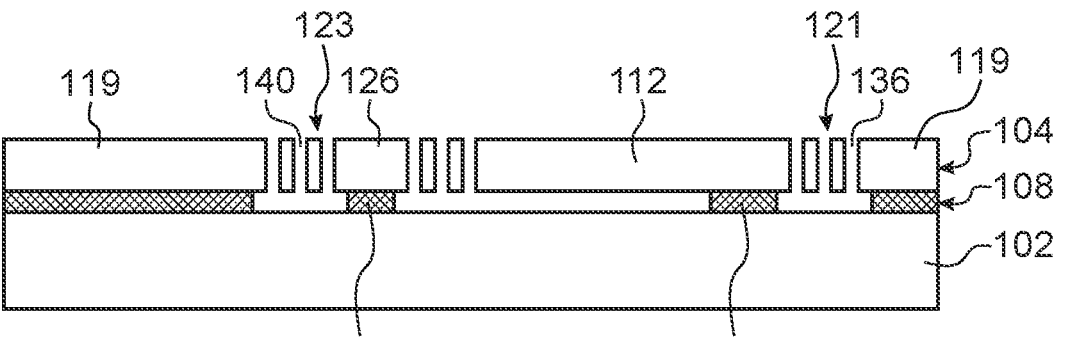

During the same etching step, the electric-insulation trenches 136, the releasing holes 140 as well as the portions 112 and 126 of the mobile elements 111, 113 and the portions of the suspension means 121, 123 connected to the portions 112, 126 are then made in the first layer 104 (FIG. 3B). In this second embodiment, the trenches 136 are not then plugged by the dielectric material 138 (but they could be, like in the first embodiment), which allows to prevent the risks of thermal expansion that can appear because of the difference in thermal expansion coefficients between the dielectric material 138 and the material of the first layer 104. Other elements for detection and/or actuation of the mobile elements 111, 113 may also be formed in the first layer 104.

A partial etching of the superficial layer 108 is then implemented in order to partially release the portions 112 and 126. Portions 160 of the sacrificial layer 108 are preserved under the portions 112, 126 (and more generally of the various elements made in the first layer 104) in order to preserve a mechanical strength of these elements during the rest of the method.

Figure 3D:
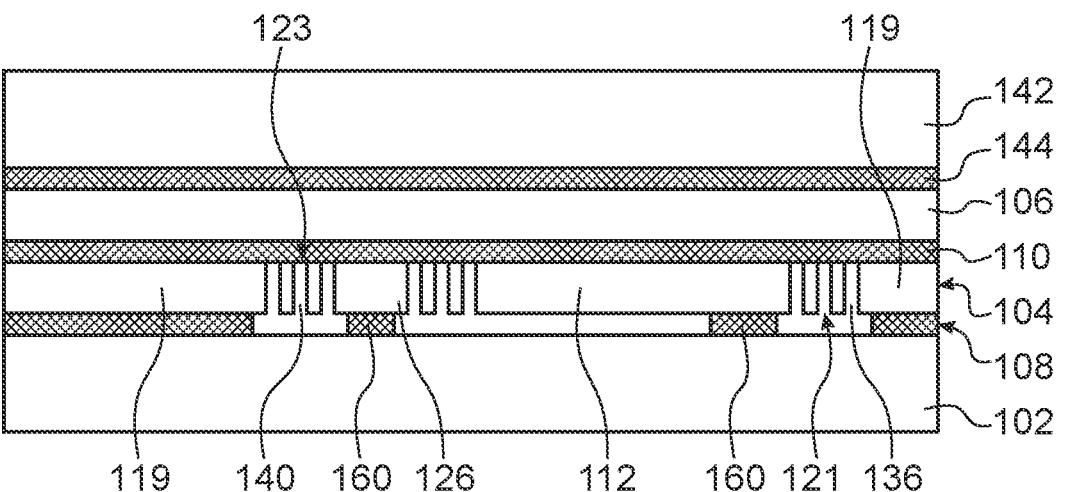

The second layer of material 106 is then made on the first layer of material 104. Like in the first embodiment, the second layer 106 corresponds here to the superficial layer of a second substrate of the type semiconductor on insulator comprising the bulk layer 142 and the buried dielectric layer 144. Moreover, the intermediate layer 110 is also present between the layers 104, 106 (FIG. 3D). The various techniques of sealing previously described for the first embodiment can apply to this second embodiment. Alternatively, the second layer of material 106 may not be the superficial layer of a substrate of the semiconductor type, but be a simple layer of material, for example of semiconductor, deposited on the first layer 104, optionally with the presence of the intermediate layer 110 between the layers 104, 106.

Figure 3E:
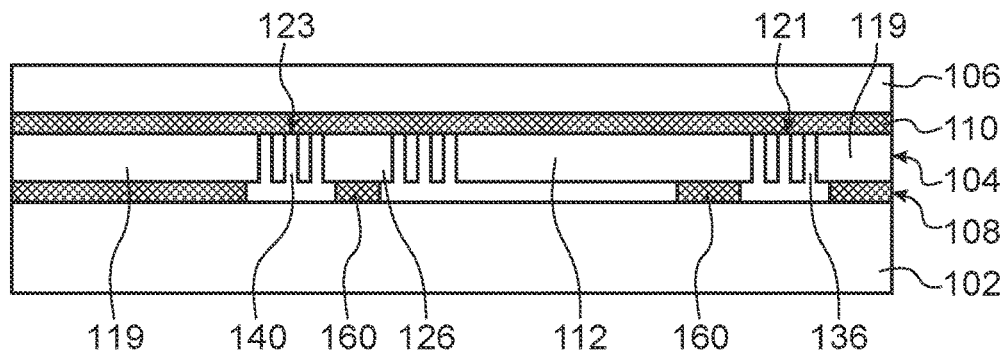

As shown in FIG. 3E, the layers 142 and 144 are removed. The second layer 106 is also thinned here to the desired thickness.

Figure 3F:
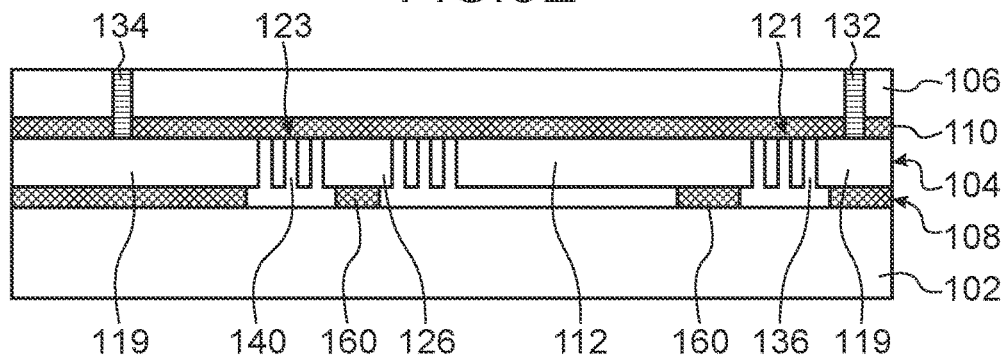
Figure 3G:
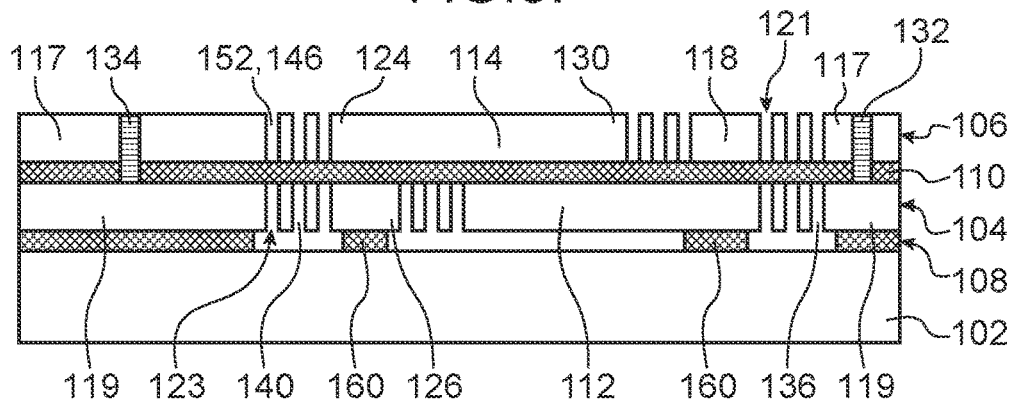

Like in the first embodiment, the two layers 104 and 106 may be electrically connected by fabricating one or more interconnection vias 132, 134 between these two layers (FIG. 3F). The second layer 106 is then structured, for example by etching, in such a way as to define the portions 114, 118, the releasing holes 152, the elements for retention 121, 123, detection and/or actuation previously described for the first embodiment (FIG. 3G). This etching is also used here to form the insulation trenches 146 which are then filled or not with the dielectric material 148 (not fold away in this second embodiment).

Figure 3H:
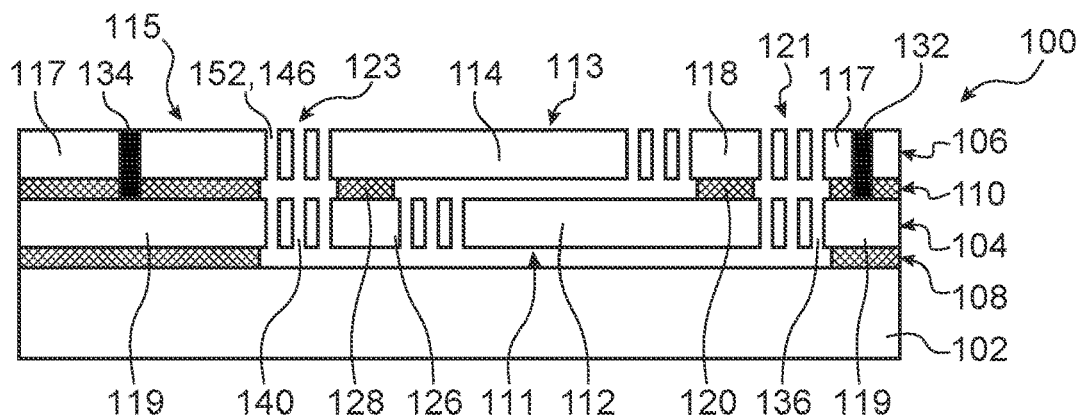

The mobile elements 111, 113 are then released via a selective removal of the materials of the layers 108, 110 with respect to the other materials of the layers 102, 104, 106, as shown in FIG. 3H. Because of the partial releasing of the elements of the first layer 104 (portions 112 and 126) previously carried out, it is not necessary to carry out, before this releasing step, an etching of the support layer 102 in order to form an access to the sacrificial layer 108. The etching agents used thus carry out the etching of the portions 160 through the releasing holes 152 and 140.

Like in the first embodiment, portions 120, 128 of the intermediate layer 110 are preserved, these portions ensuring the mechanical link between the first portions 112, 114 and the second portions 118, 126.

Moreover, like in the first embodiment, all the etchings of the first and second layers 104, 106 implemented during this method are advantageously implemented while using alignment marks, or alignment reference frame, present on the rear face of the support layer 102. Because no access to the sacrificial layer 108 is made through the support layer 102, the entire surface of the rear face of the support layer 102 is available for these alignment marks.

The microdevice 100 described above comprises two detection elements, each comprising at least one mobile element each formed from portions of the two layers 104, 106, made in an interlocking manner one above the other. Alternatively, the microdevice 100 may comprise a greater number of detection elements made in an interlocking manner above each other. For this, the steps described above in relation to FIGS. 3D to 3G are in this case repeated one or more times before carrying out the releasing of the mobile elements of these superimposed elements.

Figure 4:
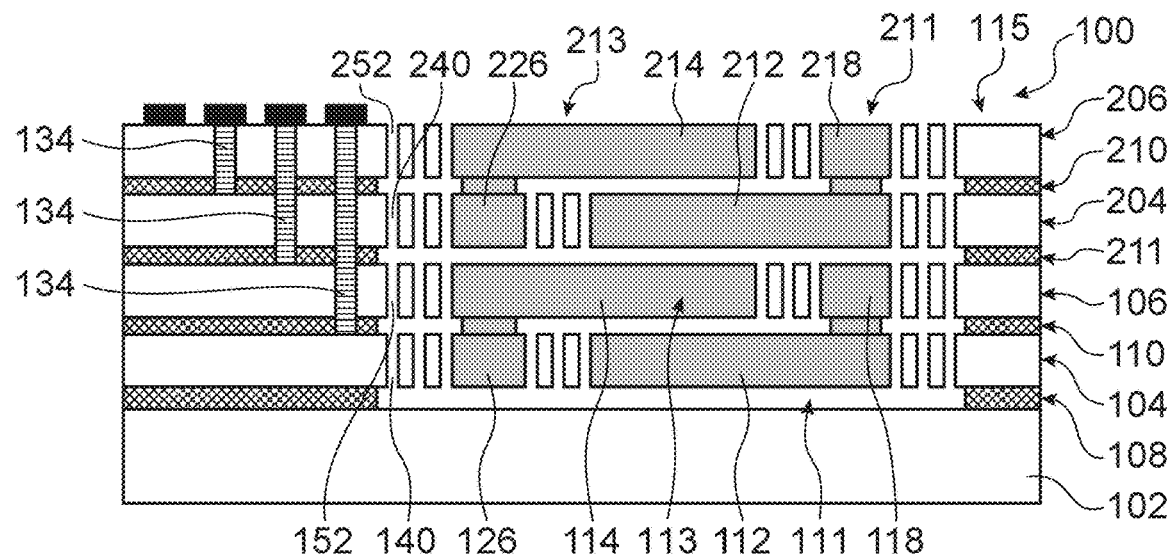

An example of realisation of such a microdevice 100 comprising a greater number of detection elements made in an interlocking manner above each other is shown in FIG. 4. In this drawing, two additional layers of material 204, 206 are arranged above the second layer 106, in which detection elements analogous to those made in the layers 104, 106 are also made, in particular mobile elements 211, 213 each suspended from the fixed portion 115 which is common to the mobile elements 111, 113, 211 and 213. The layers 204, 206 are each arranged on one of the intermediate layers 210 and 211. Moreover, in this example of realisation, the vias 134 form electric contacts for each of the layers 104, 106, 204, 206. Finally, releasing holes 240, 252 formed in the layers 204, 206 are aligned with those formed in the layers 104, 106.

It is possible for each mobile element to comprise portions of two, or of more than two, consecutive layers of material.

Figure 5:
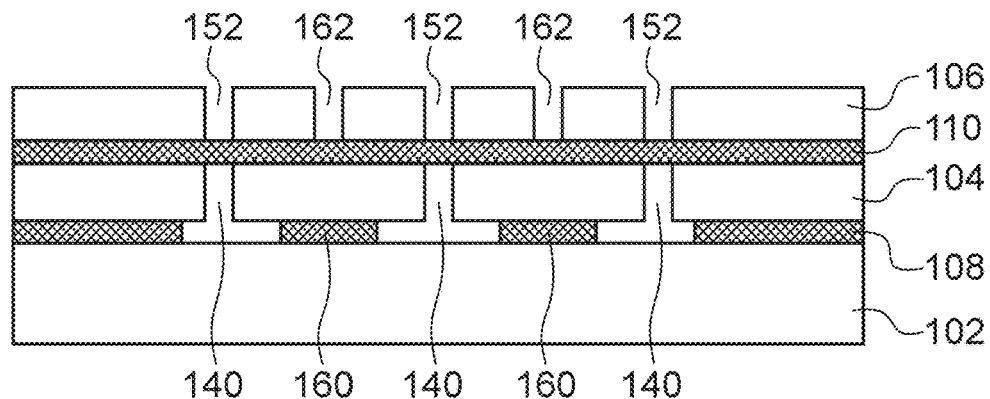
FIG. 5 shows a cross-sectional view of a portion of a microdevice, subject-matter of the present invention, before implementation of the final releasing of the mobile elements of the microdevice, in the presence of additional releasing holes formed through the second layer of material.
Figure 6A:
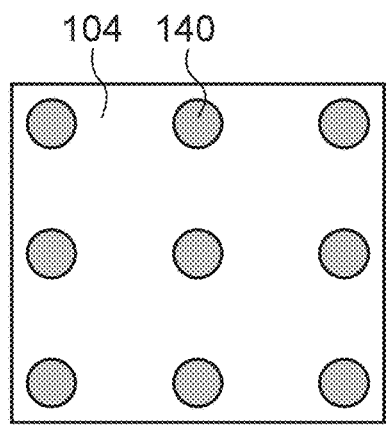
FIGS. 6A and 6B show examples of realisation of releasing holes in a microdevice, subject-matter of the present invention.
Figure 6B:
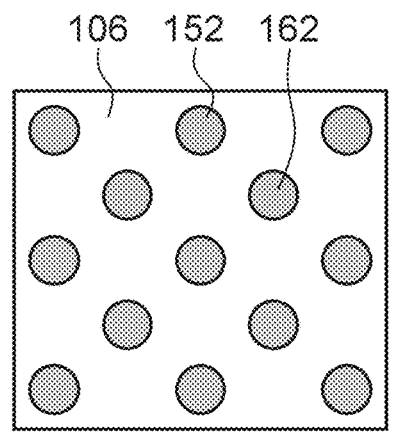

In the second embodiment described above, the releasing of the two detection elements made in the layers 104, 106 is obtained by introducing etching agents from the upper face of the second layer 106. The distance between this upper face and the portions 160 of the sacrificial layer 108 to be etched during the releasing of the detection structures is different than that between this upper face and the intermediate layer 110. Moreover, because of the partial releasing of the structure formed in the first layer 104 implemented previously to the fabrication of the second layer 106, the portions of material to be etched in the layers 108 and 110 are not the same. In order to carry out the etching of the portions 160 of the sacrificial layer 108 preserved after the step of partial releasing, the releasing holes 140 formed through the first layer 104 are aligned with at least a portion of the releasing holes 152 formed through the second layer 106. Moreover, as shown in FIG. 5, it is possible to make additional releasing holes 162 through the second layer 106 because during the final releasing step, the intermediate layer 110 has not yet been etched, contrary to the sacrificial layer 108. A top view of the first layer 104 comprising the releasing holes 140 is shown in FIG. 6A, and a top view of the second layer 106 comprising the releasing holes 152 aligned with the holes 140, as well as the additional releasing holes 162, is shown in FIG. 6B.

Figure 7:
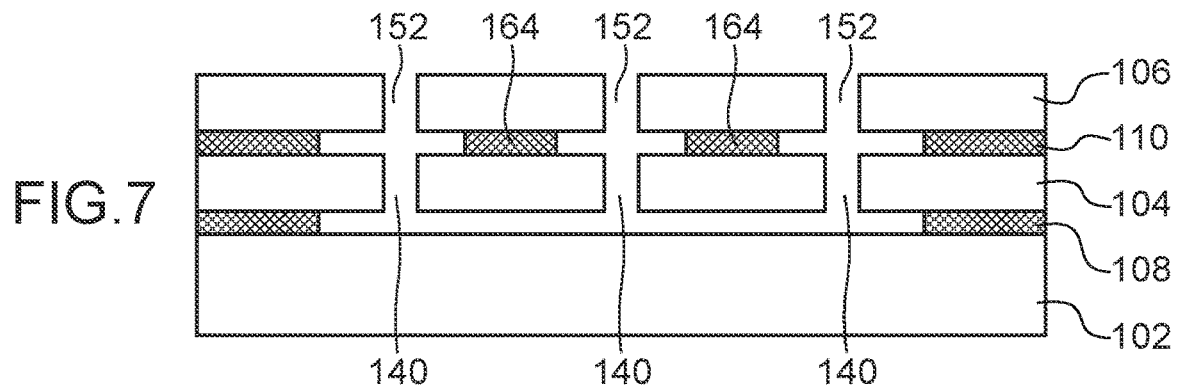
FIG. 7 shows a cross-sectional view of a portion of a microdevice, subject-matter of the present invention, after implementation of the final releasing of the mobile elements of the microdevice, in the absence of additional releasing holes formed through the second layer of material, FIG. 8 schematically shows a microdevice, subject-matter of the present invention, comprising an intermediate mobile element.

Alternatively, it is also possible to not make the additional releasing holes 162. In this case, after the releasing step, portions 164 of the intermediate layer 110 may still be present under some portions of the second layer 106 (see FIG. 7). This configuration may be advantageous when a different mechanical strength is sought for the elements formed in the second layer 106 with respect to those formed in the first layer 104.

For some uses, it can be of interest to insulate the mobile elements of the resonating microdevice 100 with respect to the vibrations exterior to this microdevice 100. For this, the microdevice 100 may be made by making the mobile structures not such that the mobiles elements 111, 113 are suspended directly from the fixed portion 115 of the microdevice 100 which comprises for example the support layer 102, but rigidly connected to an intermediate mobile element, for example in the form of a mobile frame, forming an intermediate suspension stage between the mobile elements 111, 113 and this fixed portion 115 of the microdevice 100. The mobile elements 111, 113 are in this case suspended in and from this mobile frame, itself connected to the fixed portion by suspensions means. In such a configuration, the mobile frame may, for example, be hermetically sealed in order to ensure a vacuum, or more generally an atmosphere (nature of gas, pressure, etc.) adapted to the operation of the mobile structures.

Figure 8:
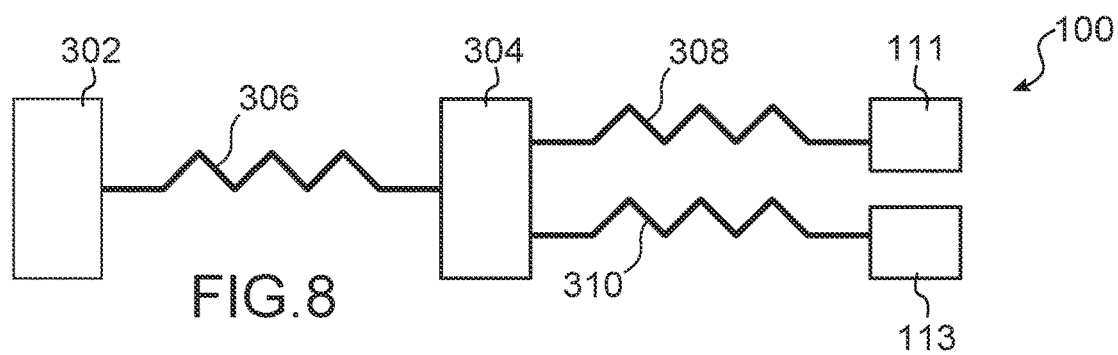

As shown schematically in FIG. 8, the microdevice 100 comprises a fixed portion 302, the support layer 102 being for example a part thereof. It also comprises an intermediate mobile element 304 corresponding, in this example of realisation, to a mobile frame. The intermediate mobile element 304 is arranged for example inside a space surrounded by a frame formed by the fixed portion 302. Moreover, the intermediate mobile element 304 is suspended from the fixed portion 302 by first retention means 306 corresponding for example to first arms for maintaining in suspension which may correspond to microbeams.

These first retention means 306 are such that the intermediate mobile element 304 can move according to one or more degrees of freedom with respect to the fixed portion 302 of the microdevice 100, for example in translation in parallel to one of the axes X, Y or Z, and/or a rotation according to at least one of the axes X, Y or Z.

Each of the mobile elements 111, 113 is connected to the intermediate mobile element 304 by second retention means 308, 310 corresponding for example to second arms for maintaining in suspension which may correspond to microbeams.

In such a microdevice 100, the intermediate mobile element 304 forms an intermediate suspension stage allowing to insulate the mobile elements 111, 113 with respect to the movements or outside vibrations to which the microdevice 100, and thus the fixed portion 302, is subjected.

An example of a method for fabricating such a microdevice 100 is described in relation to FIGS. 9A to 9K.

Figure 9A:
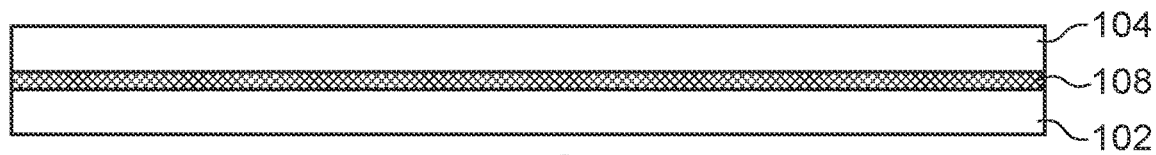
FIGS. 9A to 9K show the steps of a method for fabricating a microdevice, subject-matter of the present invention, comprising an intermediate mobile element, FIG. 10 schematically shows a microdevice, subject-matter of the present invention, according to another embodiment, FIGS. 11A and 11B schematically show a microdevice, subject-matter of the present invention, according to another embodiment, FIG. 12 schematically shows a microdevice, subject-matter of the present invention, according to another embodiment.

Like in the previous embodiments, the method is implemented starting from a stack of layers comprising the support layer 102, the sacrificial layer 108 and the first layer of material 104 (FIG. 9A).

Figure 9B:
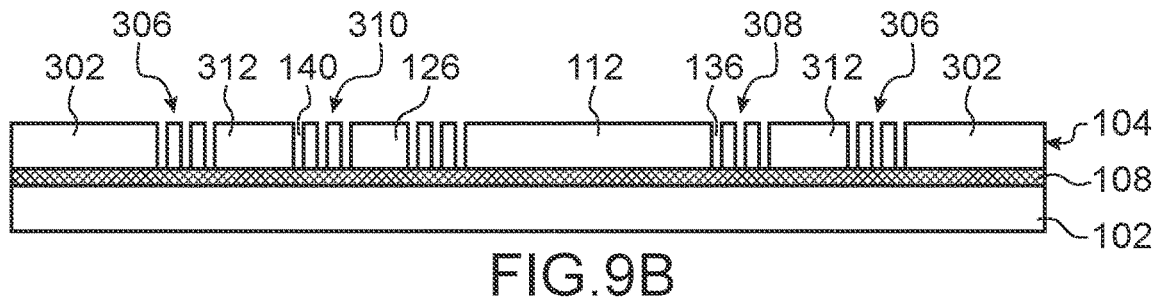

During the same etching step, the electric-insulation trenches 136, the releasing holes 140 as well as the portions 112, 126 of the mobile elements 111, 113 are then made in the first layer 104 (FIG. 9B). This etching step also defines, in the first layer 104, portions 312 of the intermediate mobile element 304 with respect to the fixed portion 302 intended to remain rigidly connected to the support layer 102. A portion of the retention elements 306, 308 and 310 may also be made.

Figure 9C:
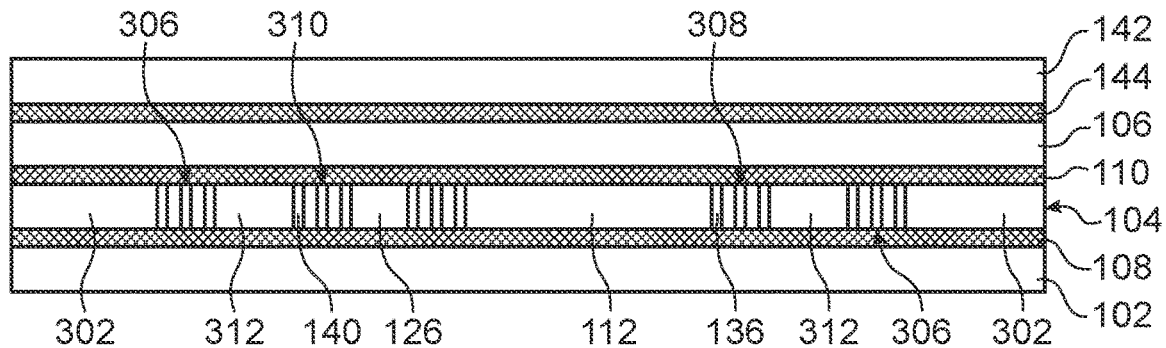

The second layer of material 106 is then made on the first layer 104, here via a transfer of substrate of the type semiconductor on insulator and via the intermediate layer 110 (FIG. 9C).

Figure 9D:
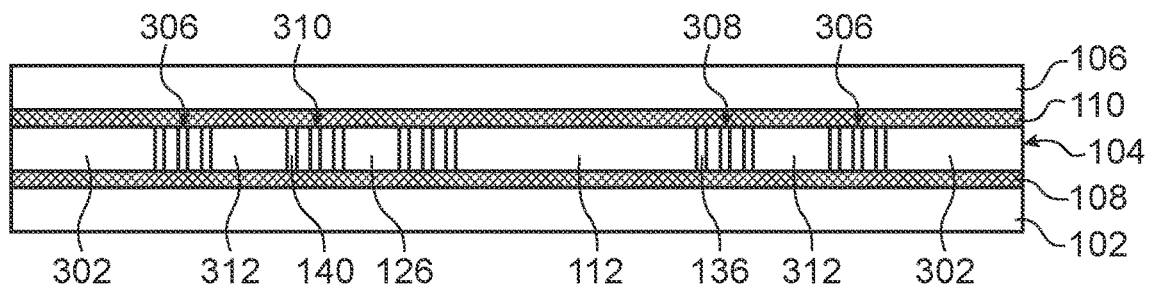

As shown in FIG. 9D, the layers 142 and 144 are removed. The second layer 106 is also thinned here to the desired thickness.

Figure 9E:
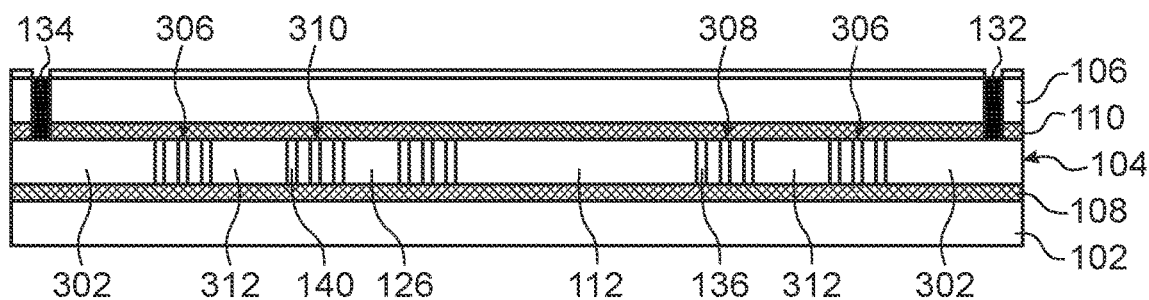

Like in the previous embodiments, the two layers 104 and 106 may be electrically connected by fabricating one or more interconnection vias 132, 134 between these two layers (FIG. 9E).

Figure 9F:
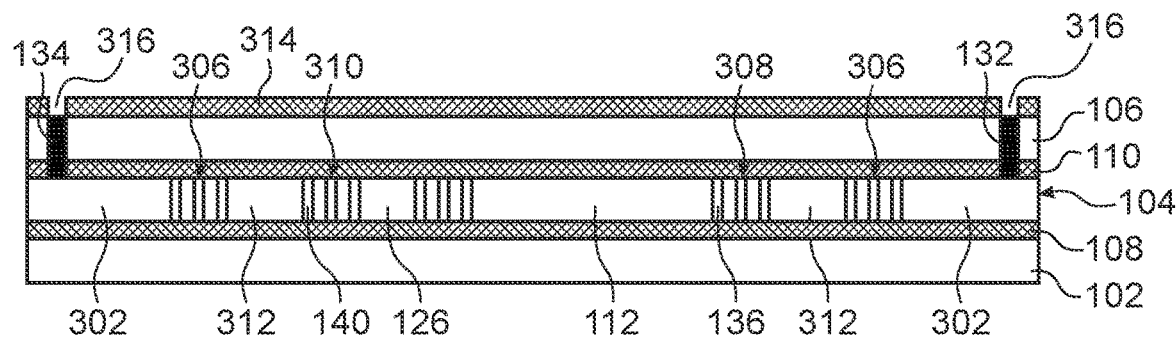

A dielectric layer 314 is then formed on the second layer 106. Openings 316 are formed through this dielectric layer 314 facing the vias 132, 134 (FIG. 9F).

Figure 9G:
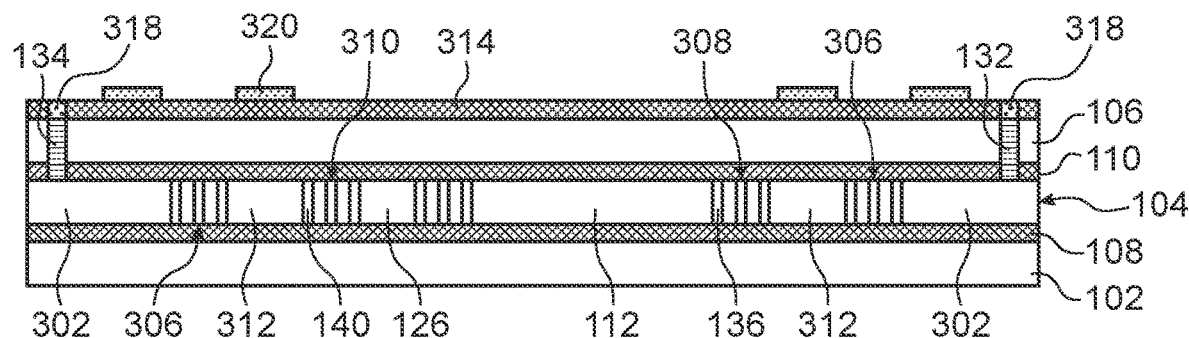

An electrically conductive layer, for example metal, is then deposited on the dielectric layer 314 and in the openings 316, then etched in order to preserve portions 318 arranged in the openings 316 forming electric contacts connected to the vias 132, 134, as well as portions 320 intended for the later fabrication of metal sealing beads intended to ensure a hermetic sealing of a first cavity in which the mobile elements 112, 114 will be arranged and of a second cavity in which the intermediate mobile element 304 will be arranged (FIG. 9G).

Figure 9H:
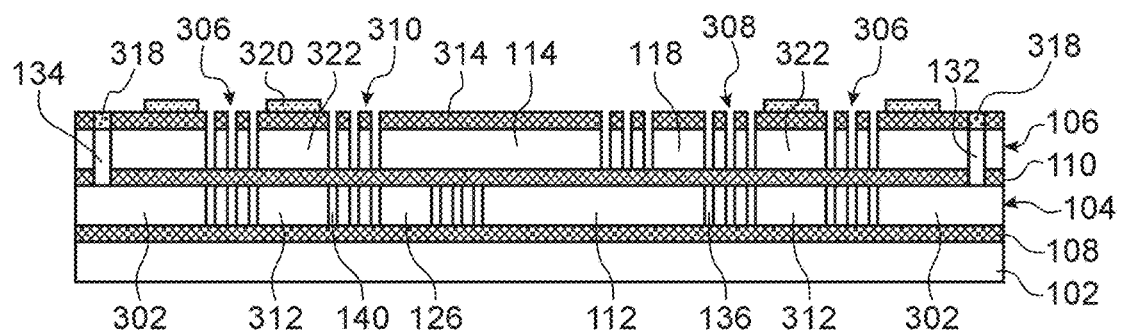

The layers 314 and 106 are then etched in order to define the portions 114 and 118 (and also the other elements for retention, detection, etc.) as well as the optional insulation trenches 146, the releasing holes 152 and also define other portions 322 of the intermediate mobile element 304 (FIG. 9H).

Figure 9I:
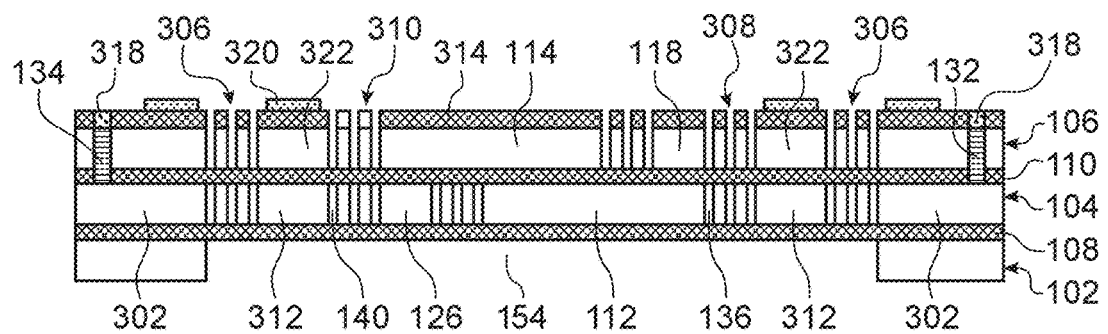

The support layer 102 is then etched in order to form an access 154 to the portions of the sacrificial layer 108 located at the portion of the microdevice 100 comprising the portions 112, 126 as well as that at which the intermediate mobile element 304 is located (FIG. 9I).

Figure 9J:
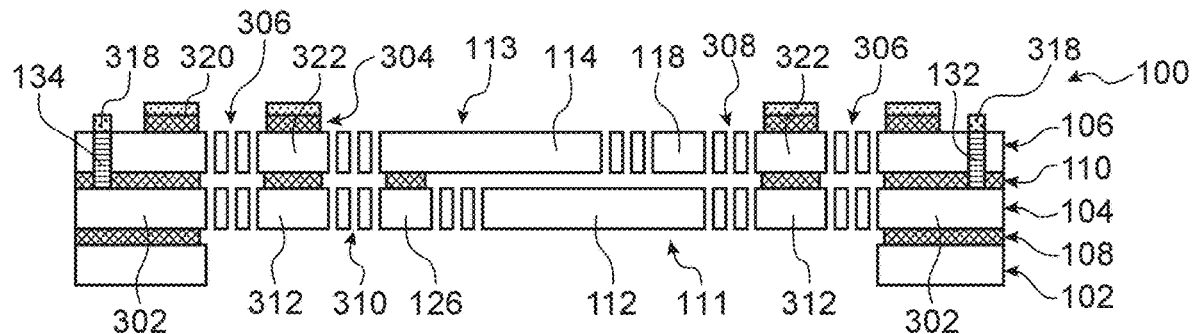

The various mobile elements of the microdevice 100 are then released by etching the portions of the layers 108 and 110 to which these mobile elements 111, 113 and 304 are linked (FIG. 9J). The portions of the layer 314 not covered by the metal portions 320 are also etched.

Figure 9K:
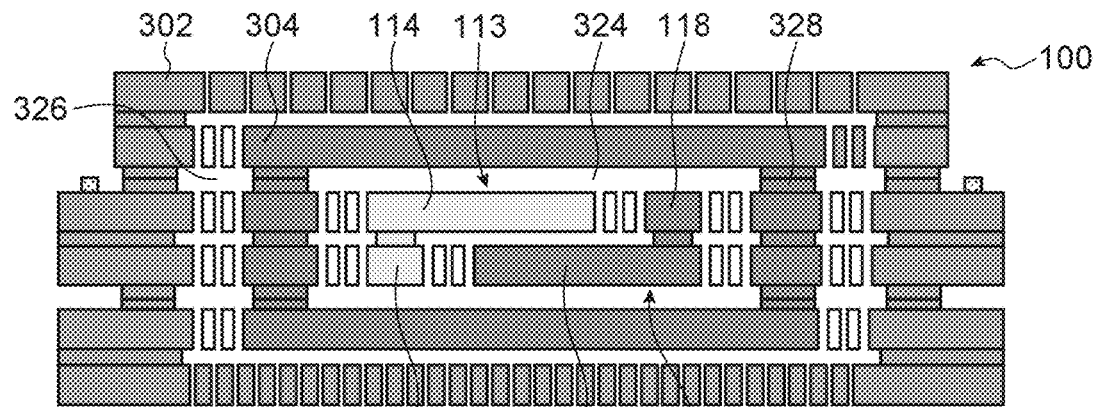

The structure thus obtained in FIG. 9J may also be encapsulated in order to form the microdevice 100 as shown in FIG. 9K, on which the detection elements comprising the mobile elements 111, 113 are encapsulated in a cavity 324 defined in particular by the intermediate mobile element 304. The intermediate mobile element 304 is itself encapsulated in a cavity 326 which includes the cavity 324. The cavities 324, 326 are for example hermetically insulated from one another via the sealing bead 328 separating them. Here, the intermediate mobile element 304 forms a mobile frame suspended from the fixed frame formed by the fixed portion 302.

In the embodiments described above, the microdevice 100 comprises a plurality of mobile elements. According to another embodiment shown in FIG. 10, the microdevice 100 comprises a single mobile element 111 formed by the first portion 112 of the first layer 104 and the second portion 118 of the second layer 106. The portions 112 and 118 are connected, or rigidly connected, to one another by means of the portion 120 of the intermediate layer 110.

This mobile element 111 forms a mobile mass capable of moving with respect to the fixed portion 115 of the microdevice 100. This fixed portion 115 comprises the portions 117 and 119 of the first and second layers 104, 106 from which the mobile element 111 is suspended by means of the first suspension means 121 formed on each side of the mobile element 111.

Figure 10:
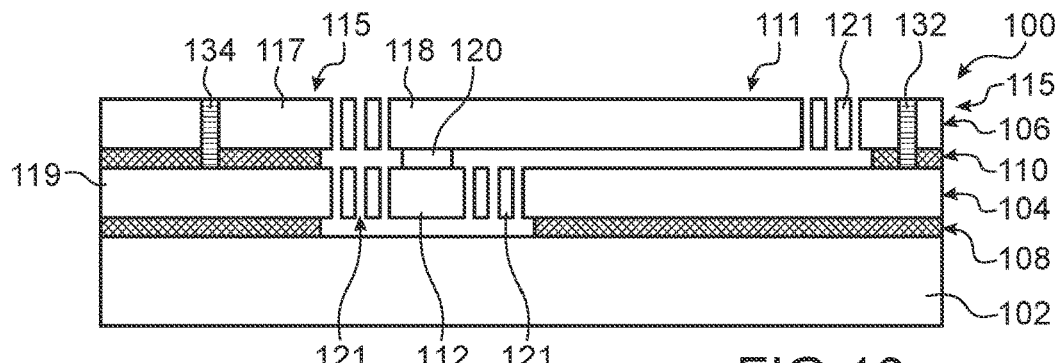

The various alternatives of realisation described for the previous embodiments can apply to the microdevice 100 shown in FIG. 10.

As an alternative to the microdevice 100 shown in FIG. 10, it is possible that the first mobile element 111 has a geometry close or similar to that of the first mobile element 111 of the microdevice 100 described above in relation to FIG. 1.

For the fabrication of the microdevice 100 shown in FIG. 10, a method similar to one of those described above may be implemented, wherein the steps implemented make a single mobile element.

Figure 11A:
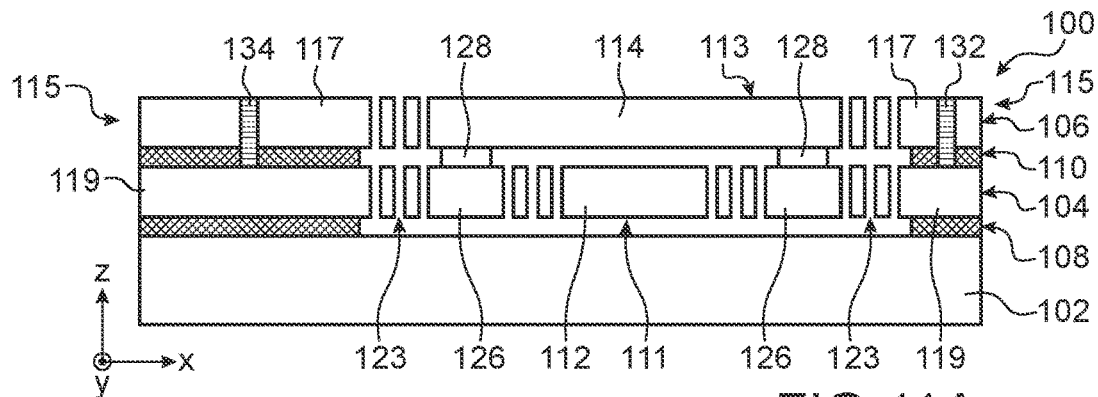
Figure 11B:
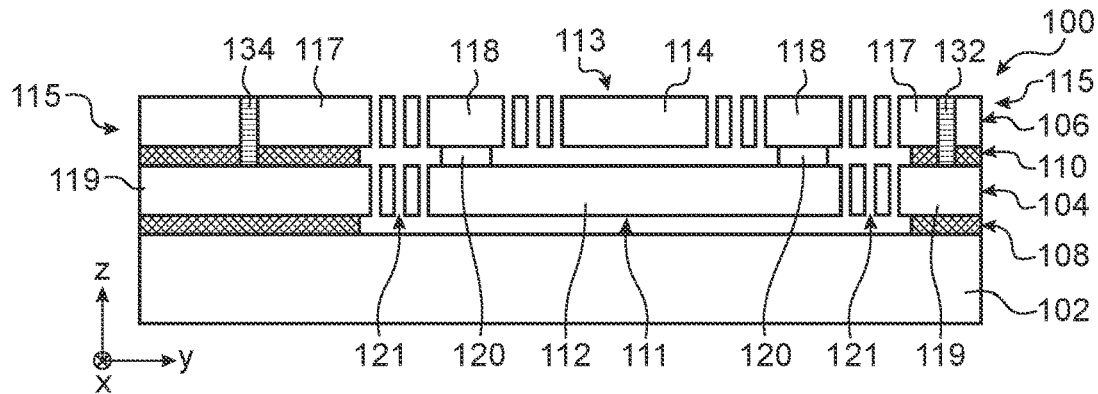

The microdevice 100 according to another embodiment different than those described above is schematically shown in two different views in FIGS. 11A and 11B.

In this other embodiment shown in FIGS. 11A and 11B, the microdevice 100 comprises the two mobile elements 111, 113. The first mobile element 111 is formed by the first portion 112 of the first layer 104 and second portions 118 of the second layer 106. The second mobile element 113 is formed by the first portion 114 of the first layer 104 and second portions 126 of the first layer 104.

In this microdevice 100, the first and second mobile elements 111, 113 form mobile masses capable of moving with respect to the fixed portion 115 of the microdevice 100 and also with respect to one another. Like above, the fixed portion 115 comprises the portions 117, 119 of the first and second layers 104, 106 from which the mobile elements 111, 113 are suspended by means of first and second suspension means 121, 123, respectively.

In this embodiment, the two mobile elements 111, 113 are arranged in an interlocking manner with respect to one another.

Moreover, in the configuration shown in FIGS. 11A and 11B, the centres of gravity of the first and second mobile elements 111, 113 are aligned one above the other according to an axis substantially perpendicular to main faces of the first and second layers of material 104, 106.

Figure 12:
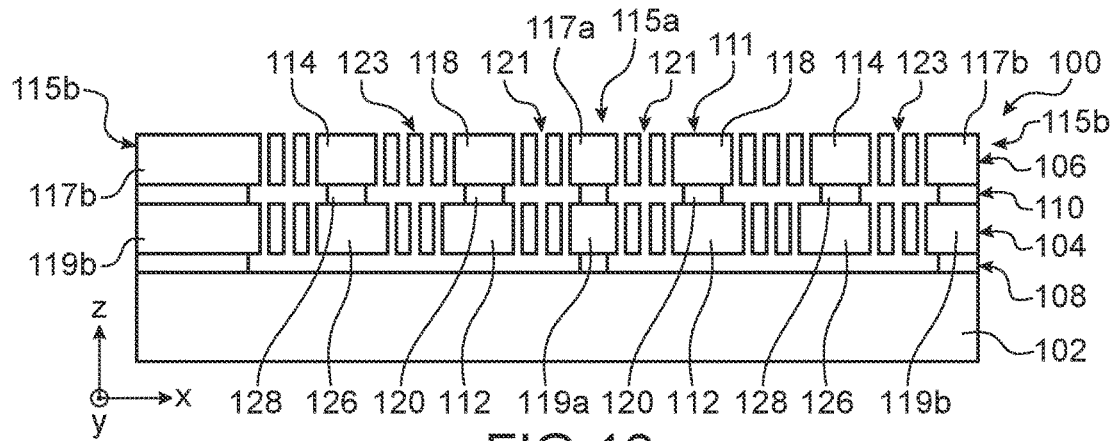

A microdevice 100 according to another embodiment different from those described above is shown in FIG. 12.

In this other embodiment, the first and second mobile elements 111, 113 are made concentrically with respect to one another. Thus, in FIG. 12, the first mobile element 111 comprises portions 112, 118 of the layers 104, 106 that at least partially surround portions 117*a*, 119*a* of the layers 104, 106 which form a fixed portion 115*a* from which the first mobile element 111 is suspended by means of the first suspension means 121. The second mobile element 113 is formed by portions 114, 126 of the layers 104, 106 arranged around the portions 112, 118 of the first mobile element 111 such that the first mobile element 111 is at least partially surrounded by the second mobile element 113. The second mobile element 113 is suspended from another fixed portion 115*b*, formed by portions 117*b*, 119*b* arranged around the second mobile element 113, by second suspension means 123.

Viewed from above, each of the mobile elements 111, 113 may have the shape of a ring or crown. Moreover, in the main plane of the layers 104, 106 (plane (X,Y)), the cross-section of the rings or crowns formed by the mobile elements 111, 113 may be circular or polygonal (square, hexagonal, etc.).

According to yet another alternative of realisation, the microdevice 100 may comprise the first mobile element 111 or the second mobile element 113 as described in one of the previous embodiments, and another mobile element which comprises one or more portions of materials of a single one of the layers of material 104, 106 (contrary to the previous embodiments described in which each mobile element comprises at least two portions of material coming from at least two distinct layers of material).

The invention claimed is:

1. Microdevice comprising at least:
    a first layer of material,
    a second layer of material,
    a fixed portion,
    a first mobile element comprising at least a first portion of the first layer of material and at least a second portion of the second layer of material,
    a second mobile element comprising at least a first portion of the second layer of material and at least a second portion of the first layer of material,
    first suspension means formed in at least one of the first layer of material or the second layer of material, and
    second suspension means formed in at least one of the first layer of material and the second layer of material,
    wherein:
    the first and second mobile elements are capable of moving with respect to one another and with respect to the fixed portion,
    the first and second layers of material are arranged one above the other,
    the first portion of the first layer of material is rigidly connected to the second portion of the second layer of material,
    the first mobile element is suspended from the fixed portion by the first suspension means,
    the second mobile element is suspended from the fixed portion by the second suspension means,
    the first portion of the second layer of material is rigidly connected to the second portion of the first layer of material,
    the first and second mobile elements are capable of moving substantially in phase opposition with respect to one another, and
    the centres of gravity of the first and second mobile elements are aligned one above the other.

2. The microdevice according to claim 1, wherein the first and second mobile elements are arranged in an interlocking and/or concentric manner with respect to one another.

3. The microdevice according to claim 1, wherein the first portion of the first layer of material is connected to the second portion of the second layer of material by means of at least a first portion of an intermediate layer arranged between the first and second layers of material, or wherein the first portion of the second layer of material is connected to the second portion of the first layer of material by means of at least a second portion of the intermediate layer.

4. The microdevice according to claim 1, further comprising at least one of the following elements:
   elements for detection or measurement of a movement of the first mobile element or of the second mobile element with respect to the fixed portion,
   elements for detection or measurement of a movement of the first mobile element with respect to the second mobile element,
   elements capable of moving the first mobile element or the second mobile element with respect to the fixed portion,
   elements capable of moving the first mobile element with respect to the second mobile element.

5. The microdevice according to claim 1, wherein at least one of the first mobile element and the second mobile element is capable of moving in translation or in rotation with respect to the fixed portion or with respect to one another.

6. The microdevice according to claim 1, wherein the fixed portion comprises portions of the first and second layers of material arranged around the first and second mobile elements or surrounded by the first and second mobile elements.

7. The microdevice according to claim 1, wherein the fixed portion comprises a support layer such that the first layer of material is arranged between the support layer and the second layer of material.

8. The microdevice according to claim 1, further comprising at least one intermediate mobile element suspended from the fixed portion and capable of moving with respect to the fixed portion, and wherein the first and second mobile elements are suspended from the intermediate mobile element and capable of moving with respect to the intermediate mobile element and the fixed portion.

9. The microdevice according to claim 8, wherein:
   the fixed portion comprises a fixed frame at least partially surrounding the intermediate mobile element, and the intermediate mobile element forms a mobile frame suspended from the fixed frame, or
   the microdevice further comprises a first cavity, at least a portion of the walls of which is formed by the fixed portion and in which the intermediate mobile element is encapsulated, and a second cavity arranged in the first cavity, at least a portion of the walls of which is formed by the intermediate mobile element and in which the first and second mobile elements are encapsulated.

10. The microdevice according to claim 1, wherein the centres of gravity of the first and second mobile elements are aligned one above the other on an axis substantially perpendicular to main faces of the first and second layers of material.

11. The microdevice according to claim 1, wherein the first and second mobile elements are symmetrical with respect to a centre of symmetry.

12. The microdevice according to claim 11, wherein the centres of gravity of the first and second mobile elements are aligned one above the other on an axis that passes through the centre of symmetry and is substantially perpendicular to main faces of the first and second layers of material.

13. A method for fabricating a microdevice, comprising at least:
   etching of a first layer of material such that at least a first portion of the first layer of material forms a first portion of at least a first mobile element and at least a second portion of the first layer of material forms a first portion of at least a second mobile element,
   fabrication of a second layer of material on the first layer of material, and
   etching of the second layer of material such that at least a second portion of the second layer of material forms a second portion of the first mobile element and is rigidly connected to the first portion of the first layer of material and at least a first portion of the second layer of material forms a second portion of the second mobile element and is rigidly connected to the second portion of the first layer of material,
   these steps being implemented such that:
   the first mobile element is suspended from a fixed portion by first suspension means formed in at least one of the first layer of material or the second layer of material,
   the second mobile element is suspended from the fixed portion by second suspension means formed in at least one of the first layer of material or in the second layer of material,
   the first and second mobile elements are capable of moving with respect to one another and with respect to the fixed portion,
   the first and second mobile elements are capable of moving substantially in phase opposition with respect to one another, and
   the centres of gravity of the first and second mobile elements are aligned one above the other.

14. The method according to claim 13, wherein the fabrication of the second layer of material on the first layer of material comprises a transfer of the second layer of material onto the first layer of material such that an intermediate layer is arranged between the first and second layers of material, the method further comprising, after the etching of the second layer of material, an etching of the intermediate layer such that at least a first portion of the intermediate layer connects the first portion of the first layer of material to the second portion of the second layer of material and, when the second mobile element is made, at least a second portion of the intermediate layer connects the first portion of the second layer of material to the second portion of the first layer of material.

15. The method according to claim 13, wherein a sacrificial layer is arranged between the first layer of material and a support layer, the method further comprising, after the etching of the second layer of material, the fabrication of an access to the sacrificial layer through the support layer then an etching of a portion of the sacrificial layer via the access formed through the support layer, releasing at least the first portion of the first layer of material with respect to the support layer.

16. The method according to claim 13, wherein a sacrificial layer is arranged between the first layer of material and a support layer, the method further comprising, between the etching of the first layer of material and the fabrication of the second layer of material, an etching of a first portion of the sacrificial layer partially releasing at least the first portion of the first layer of material with respect to the support layer, and after the etching of the second layer of material, an etching of a second portion of the sacrificial layer via openings formed through the first and second layers of material during the previous etchings of the first and second layers of material, completing the releasing of the first portion of the first layer of material with respect to the support layer.

17. The method according to claim 16, wherein the steps of etching of the first and second layers of material form releasing holes passing through the first and second layers of material and which are aligned above each other.

18. The method according to claim 17, wherein the step of etching of the second layer of material forms additional releasing holes passing through the second layer of material.

19. The method according to claim 13, wherein the steps of etching of the first and second layers of material are implemented while using the same system of alignment marks arranged at a rear surface of a support of the first and second layers of material.

\* \* \* \* \*